(12) United States Patent
Li et al.

(10) Patent No.: US 9,601,607 B2
(45) Date of Patent: Mar. 21, 2017

(54) DUAL MODE TRANSISTOR

(71) Applicant: QUALCOMM Incorporated, San Diego, CA (US)

(72) Inventors: Xia Li, San Diego, CA (US); Daeik Daniel Kim, San Diego, CA (US); Bin Yang, San Diego, CA (US); Jonghae Kim, San Diego, CA (US); Daniel Wayne Perry, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 117 days.

(21) Appl. No.: 14/225,836

(22) Filed: Mar. 26, 2014

(65) Prior Publication Data

US 2015/0145592 A1 May 28, 2015

Related U.S. Application Data

(60) Provisional application No. 61/909,533, filed on Nov. 27, 2013.

(51) Int. Cl.
*H03K 17/687* (2006.01)
*H01L 29/739* (2006.01)
*G05F 3/16* (2006.01)
*H01L 27/07* (2006.01)

(52) U.S. Cl.
CPC .......... *H01L 29/7393* (2013.01); *G05F 3/16* (2013.01); *H01L 27/0705* (2013.01)

(58) Field of Classification Search
None
See application file for complete search history.

(56) References Cited

U.S. PATENT DOCUMENTS

| 5,101,257 | A | | 3/1992 | Hayden et al. |
| 5,498,885 | A | * | 3/1996 | Deen ................. H03D 7/12 257/139 |
| 5,717,241 | A | * | 2/1998 | Malhi ................. H01L 27/0722 257/273 |
| 5,892,264 | A | * | 4/1999 | Davis ................. H01L 21/8228 257/511 |

(Continued)

FOREIGN PATENT DOCUMENTS

| JP | H02294063 A | 12/1990 |
| WO | 2013081259 A1 | 6/2013 |

OTHER PUBLICATIONS

International Search Report and Written Opinion for International Application No. PCT/US2014/065539, ISA/EPO, Date of Mailing Feb. 20, 2015, 11 pages.

*Primary Examiner* — Lincoln Donovan
*Assistant Examiner* — Khareem E Almo
(74) *Attorney, Agent, or Firm* — Toler Law Group, PC

(57) ABSTRACT

A method includes biasing a first gate voltage to enable unipolar current to flow from a first region of a transistor to a second region of the transistor according to a field-effect transistor (FET)-type operation. The method also includes biasing a body terminal to enable bipolar current to flow from the first region to the second region according to a bipolar junction transistor (BJT)-type operation. The unipolar current flows concurrently with the bipolar current to provide dual mode digital and analog device in complementary metal oxide semiconductor (CMOS) technology.

30 Claims, 18 Drawing Sheets

(56) References Cited

U.S. PATENT DOCUMENTS

| | | | |
|---|---|---|---|
| 6,191,451 B1* | 2/2001 | Nowak | H01L 27/0248 257/347 |
| 6,348,372 B1* | 2/2002 | Burr | H01L 21/761 257/E21.544 |
| 6,385,028 B1* | 5/2002 | Kouno | H01L 27/0629 257/E27.016 |
| 6,670,677 B2* | 12/2003 | Choe | H01L 21/6835 257/355 |
| 6,693,331 B2* | 2/2004 | Mistry | H01L 21/823807 257/269 |
| 6,878,605 B2* | 4/2005 | Kim | H01L 27/1203 257/E21.703 |
| 6,979,869 B2* | 12/2005 | Chen | H01L 27/0277 257/356 |
| 7,095,092 B2* | 8/2006 | Zhu | H01L 29/861 257/506 |
| 7,582,938 B2* | 9/2009 | Chen | H01L 27/0277 257/355 |
| 7,696,580 B2* | 4/2010 | Chen | H01L 27/0255 257/370 |
| 8,217,457 B1* | 7/2012 | Sengupta | H01L 27/0266 257/355 |
| 8,304,838 B1* | 11/2012 | Chen | H01L 27/0255 257/355 |
| 8,564,079 B2* | 10/2013 | Kang | H01L 43/08 257/421 |
| 9,019,667 B2* | 4/2015 | Gill | H02H 9/044 361/56 |
| 9,111,752 B1* | 8/2015 | Chen | H01L 27/0262 |
| 2002/0070408 A1* | 6/2002 | Schnaitter | H01L 27/0259 257/356 |
| 2002/0109190 A1* | 8/2002 | Ker | H01L 29/87 257/355 |
| 2002/0153586 A1* | 10/2002 | Majumdar | H01L 29/7395 257/506 |
| 2003/0047750 A1* | 3/2003 | Russ | H01L 27/0262 257/173 |
| 2006/0131606 A1* | 6/2006 | Cheng | H01L 29/66795 257/190 |
| 2006/0273372 A1 | 12/2006 | Voldman et al. | |
| 2007/0007545 A1* | 1/2007 | Salcedo | H01L 29/87 257/127 |
| 2008/0265250 A1* | 10/2008 | Huang | G02F 1/136204 257/48 |
| 2009/0256204 A1 | 10/2009 | Cai et al. | |
| 2010/0090281 A1* | 4/2010 | Meneghesso | H01L 29/0847 257/348 |
| 2010/0244143 A1* | 9/2010 | Yang | H01L 21/82285 257/370 |
| 2013/0270508 A1* | 10/2013 | Li | H01L 45/1206 257/4 |
| 2014/0327083 A1 | 11/2014 | Park et al. | |
| 2015/0085407 A1* | 3/2015 | Chen | H01L 21/768 361/56 |
| 2015/0236009 A1* | 8/2015 | Gill | H01L 27/0259 257/491 |

* cited by examiner

*200*

| Gate Control PNP | |
|---|---|
| $V_1$ | $V_{GS}: 0 \sim V_{dd}$ |
| $V_d$ | 0 |
| $V_s$ | $V_{dd}$ |
| $V_2$ | $V_2 < -V_{forward\_pn}$ |
| Operation | Bipolar + Unipolar |

*210*

| Gate Control NPN | |
|---|---|
| $V_1$ | $V_{GS}: V_{dd} \sim 0$ |
| $V_d$ | $V_{dd}$ |
| $V_s$ | 0 |
| $V_2$ | $V_2 > V_{forward\_pn}$ |
| Operation | Bipolar + Unipolar |

*FIG. 2*

DUAL MODE TRANSISTOR

I. CLAIM OF PRIORITY

The present application claims priority from U.S. Provisional Patent Application No. 61/909,533, filed Nov. 27, 2013, entitled "DUAL MODE TRANSISTOR," the content of which is incorporated by reference herein in its entirety.

II. FIELD

The present disclosure is generally related to a dual mode digital and analog transistor.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

The circuitry within wireless telephones and other electronic devices may include transistors. Transistors may selectively enable current flow between other circuit elements within an electronic device. An amount of current generated by a transistor may be based on a supply voltage provided to the transistor. A transistor that generates relatively high current may enable faster state changes and decreases latency for other circuit components of the electronic device that are dependent on the current for digital applications (on and off two states). Typically, the amount of current generated by a transistor increases as the supply voltages increases. However, increased supply voltages may result in increased power consumption of the electronic device, decreasing battery life. Certain conventional complementary metal oxide semiconductor (CMOS) transistors are not efficient bipolar devices for high performance analog and radio frequency (RF) applications. For example, digital CMOS transistors may be used for low cost analog and RF applications; however, poor performance (e.g., low bipolar current gain (beta)) and complex circuitry may result from using digital CMOS transistors for analog and RF applications.

IV. SUMMARY

Apparatuses and methods to bias a transistor to concurrently operate in a unipolar operation mode (e.g., CMOS mode) and a bipolar operation mode (e.g., bipolar junction transistor (BJT)) are disclosed. A metal oxide semiconductor (MOS) transistor may include a MOS transistor components and a horizontal parasitic bipolar transistor. In a digital MOS operation, the horizontal parasitic bipolar transistor may be deactivated (e.g., turned off) and no bipolar transistor effect may be present. The parasitic horizontal bipolar transistor may be activated (e.g., turned on) with a gate of the MOS transistor to enhance bipolar transistor efficiency. For example, the gate and a body of the transistor may be biased to enable the horizontal parasitic bipolar transistor (e.g., a gate controlled bipolar junction transistor) for analog and RF application. For example, biasing the gate may improve the bipolar transistor efficiency, and biasing the body via a terminal may turn on the bipolar transistor. In a first configuration, the gate of the transistor may be biased such that the transistor operates in a digital MOS mode (e.g., the unipolar operation mode). For example, the gate may be biased such that a gate-to-source voltage of the transistor is larger than a threshold voltage to enable a unipolar drive current (e.g., holes or electrons) to flow from a source (or drain) of the transistor (e.g., a PMOS transistor or an NMOS transistor) to a drain (or source) of the transistor (e.g., the unipolar operation mode). In a second configuration, the body (e.g., well) may be biased via the terminal such that the parasitic bipolar transistor also operates according to an analog gate control bipolar junction transistor (BJT) mode (e.g., the bipolar operation mode). In the second configuration, a unipolar current associated with the unipolar operation mode and a bipolar current associated with the bipolar operation mode flow concurrently. For example, the body may operate as a base of a P type BJT, the source may operate as an emitter of a P type BJT, and the drain may operate as a collector of a P type BJT. The body may be biased such that an absolute value of a body-to-source voltage is greater than a p-n forward junction voltage of the parasitic bipolar transistor. Such biasing of the body enables a bipolar current (e.g., holes and electrons) to flow between the source (emitter) and the drain (collector). The bipolar current may be tuned by the base current. Thus, concurrently biasing the gate and the body (as described) may enable bipolar transistor operation and increased current flow (e.g., unipolar current flow and bipolar current flow), which may improve analog & RF operating efficiency and/or digital operating efficiency (e.g., a high performance analog & RF gate controlled bipolar transistor and with greater current gain without increasing the supply voltage) of the transistor.

In a particular embodiment, a method includes biasing a first gate voltage to enable unipolar current to flow from a first region of a transistor to a second region of the transistor according to a field-effect transistor (FET)-type operation. The method also includes biasing a first body terminal region to enable bipolar transistor current to flow from the first region to the second region with a first body base region current control according to a bipolar junction transistor (BJT)-type operation. The unipolar current flows concurrently with the bipolar current.

In another particular embodiment, an apparatus includes a first gate region of a transistor that is biased via a first gate voltage to enable a unipolar current to flow from a first region of the transistor to a second region of the transistor according to a field-effect transistor (FET)-type operation. The apparatus also includes a first body region of the transistor that is biased via a first body voltage to enable bipolar current to flow from the first region of the transistor to the second region of the transistor with first body (base) region current control according to a bipolar junction transistor (BJT)-type operation.

In another particular embodiment, a non-transitory computer readable medium includes instructions that, when executed by a processor, cause the processor to bias a first gate voltage of a gate of a transistor to enable a unipolar current to flow from a first region of the transistor to a second region of the transistor. The instructions are also executable by the processor to bias a terminal coupled to a body region of the transistor to a second voltage such that an absolute value of a body-to-source voltage is greater than a pn junction forward voltage of the bipolar transistor. Biasing the terminal enables a bipolar current to flow from the first region of the transistor to the second region of the transistor with a body (base) region current control.

In another particular embodiment, an apparatus includes means for biasing a first gate voltage to enable unipolar current to flow from a first region of a transistor to a second region of the transistor according to a field-effect transistor (FET)-type operation. The apparatus also includes means for biasing a body terminal to enable bipolar current to flow from the first region of the transistor to the second region of the transistor with a body base current control according to a bipolar junction transistor (BJT)-type operation.

In another particular embodiment, a method includes a step for biasing a first gate voltage to enable unipolar current to flow from a first region of a transistor to a second region of the transistor according to a field-effect transistor (FET)-type operation. The method also includes a step for biasing a body terminal to enable bipolar current to flow from the first region of the transistor to the second region of the transistor with a body base current control according to a bipolar junction transistor (BJT)-type operation.

In another particular embodiment, a method includes receiving design information representing at least one physical property of a semiconductor device. The semiconductor device includes a first gate region of a transistor that is biased via a first gate voltage to enable a unipolar current to flow from a first region of the transistor to a second region of the transistor according to a field-effect transistor (FET)-type operation. The semiconductor device also includes a first body region of the transistor that is biased via a first body voltage to enable bipolar current to flow from the first region of the transistor to the second region of the transistor with the first body base current control according to a bipolar junction transistor (BJT)-type operation. The method also includes transforming the design information to comply with a file format. The method further includes generating a data file (e.g., a GDSII format file or a GERBER format file) including the transformed design information.

One particular advantage provided by at least one of the disclosed embodiments is increased current capacity of a transistor. Another particular advantage provided by at least one of the disclosed embodiments is enabled gate controlled bipolar transistor in a CMOS compatible process without (or with a minimum) cost adder. Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

FIG. 2 depicts particular illustrative tables corresponding to biasing characteristics for a dual mode transistor;

VI. DETAILED DESCRIPTION

Figure 1:
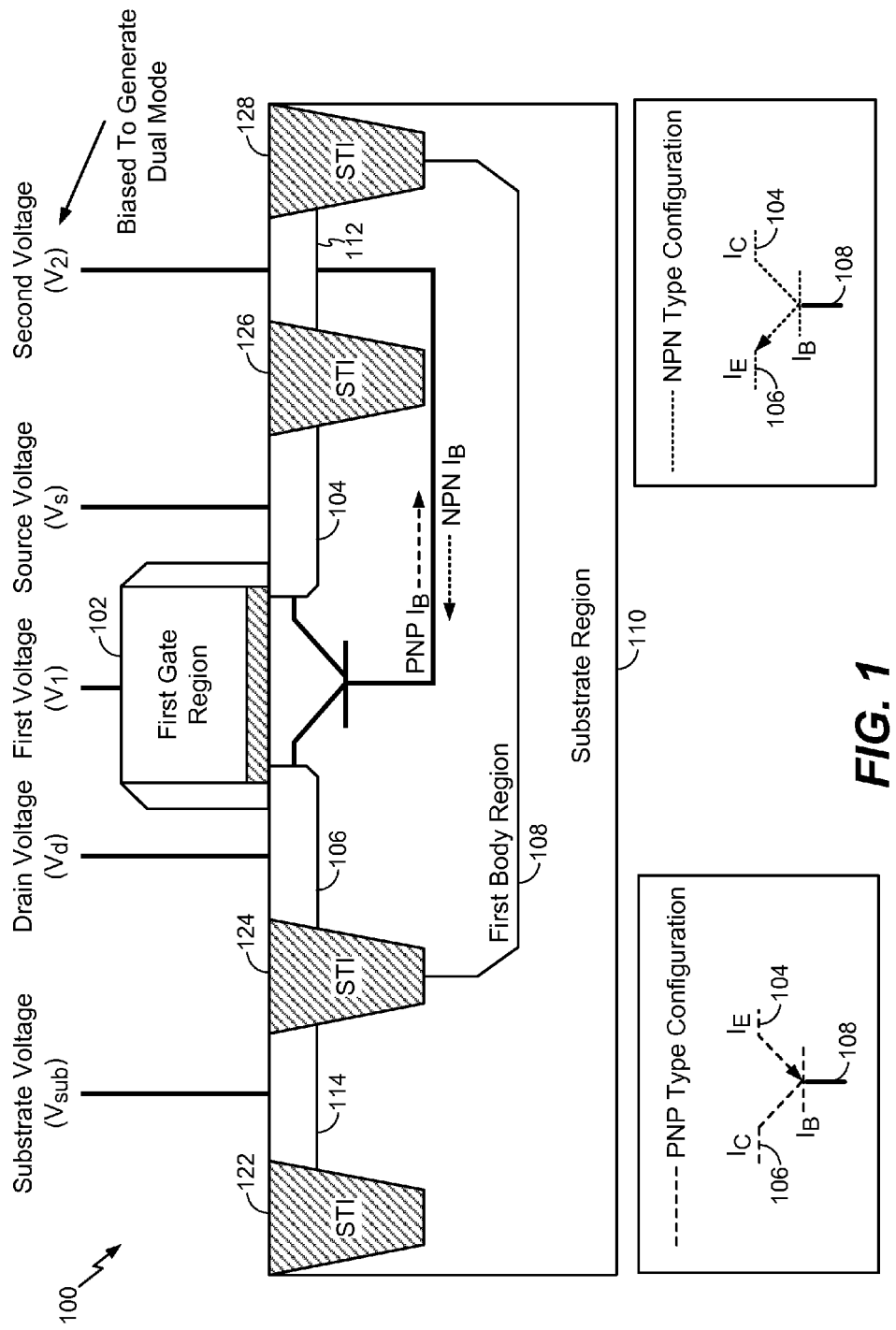
FIG. 1 is a diagram of a particular illustrative embodiment of a dual mode transistor.

Referring to FIG. 1, a particular illustrative embodiment of a dual mode transistor 100 is shown. For example, the dual mode transistor 100 may concurrently operate in a digital metal oxide semiconductor (MOS) mode (e.g., a unipolar operation mode) and an analog gate control bipolar junction transistor (BJT) mode (e.g., bipolar operation mode). The illustrative embodiment in FIG. 1 depicts a cross-sectional view of the dual mode transistor 100.

The dual mode transistor 100 includes a first gate region 102, a first region 104, a second region 106, and a first body region 108. The first gate region 102 may correspond to a gate of the dual mode transistor 100. In a particular embodiment (e.g., a PNP type configuration), the first region 104 may correspond to a source of the dual mode transistor 100, and the second region 106 may correspond to a drain of the dual mode transistor 100. In another particular embodiment (e.g., an NPN type configuration), the first region 104 may correspond to a drain of the dual mode transistor 100, and the second region 106 may correspond to a source of the dual mode transistor 100. The first body region 108 may correspond to a well. A dielectric may separate the first gate region 102 from the first region 104, the second region 106, and the first body region 108. The dielectric may be an insulating layer comprised of a material with a high dielectric constant. The dual mode transistor 100 may be within a substrate region 110. As explained below, concentrations of each region 102-108 may vary based on a particular configuration of the dual mode transistor 100 (e.g., whether the dual mode transistor has an NMOS & NPN type configuration or a PMOS & PNP type configuration).

The dual mode transistor 100 also includes a first terminal 112 coupled to the first body region 108, and a second terminal 114 coupled to the substrate region 110. A first shallow trench isolation (STI) area 122 may prevent (or reduce) current leakage (from another transistor structure) from affecting the dual mode transistor 100. A second STI area 124 may prevent (or reduce) current leakage between the second terminal 114 and the second region 106. A third STI area 126 may prevent (or reduce) current leakage between the first region 104 and the first terminal 112, and a fourth STI area 128 may prevent (or reduce) current leakage (from another transistor structure) from affecting the dual mode transistor 100.

A first gate voltage of the first gate region 102 may be biased to a first voltage ($V_1$). Biasing the first gate voltage may enable unipolar current to flow from the first region 104 to the second region 106 according to a field effect transistor (FET)-type operation. For example, a source voltage ($V_s$) may be applied to the first region 104. When the gate-to-source voltage (e.g., a voltage difference between the first voltage ($V_1$) and the source voltage ($V_s$)) exceeds a particular voltage level, an inversion layer (e.g., a channel) may be formed within the first body region 108 between the first region 104 and the second region 106. In a particular embodiment, the particular voltage level may be much more than a threshold voltage ($V_t$) of the dual mode transistor 100 to enable a saturation region current to flow. In another particular embodiment, the particular voltage level may be just above than the threshold voltage ($V_t$) to enable a triode (linear) region current to flow. In another particular embodiment, the particular voltage level may be less than the threshold voltage ($V_t$) to turn off current. The unipolar current may flow from the first region 104 to the second region 106 via the inversion layer. Based on the configuration of the dual mode transistor 100, the unipolar current may include electrons flowing from the second region 106 to the first region 104 (e.g., a NPN type configuration), or the unipolar current may include holes flowing from the first region 104 to the second region 106 (e.g., a PNP type configuration). In the illustrated embodiment, a drain voltage ($V_d$) may be applied to the second region 106, and a substrate voltage ($V_{sub}$) may be applied to the second terminal 114. For silicon-on-insulator (SOI) technology, the substrate region 110 may be an oxide layer and the STIs 122-128 may be deep down in the oxide layer. In SOI technology, the substrate voltage ($V_{sub}$) (e.g., the voltage applied to the second terminal 114) can be removed.

The first terminal 112 (coupled to the first body region 108) may be biased to a second voltage ($V_2$). Biasing the first terminal 112 may enable bipolar current to flow between the first region 104 and the second region 106 according to a BJT-type operation with the first terminal 112 current tuning. For example, the first terminal 112 may be biased such that an absolute value of a body-to-source voltage (e.g., a voltage difference between the second voltage ($V_2$) and the source voltage ($V_s$)) is greater than a pn forward junction voltage ($V_j$) of the dual mode transistor 100. To illustrate, biasing the first terminal 112 to the second voltage ($V_2$) may enable the first body region 108 to operate in a substantially similar manner as a base of a BJT and turn on horizontal gate controlled BJT.

As described herein, a "junction voltage" ($V_j$) may correspond to a forward bias voltage between a p-type region and an n-type region. For example, a positive terminal may be coupled to the p-type region and a negative terminal may be coupled to the n-type region. In a horizontal PNP configuration, the p-type region may correspond to the first region 104 and to the second region 106, and the n-type region may correspond to the first body region 108. Alternatively, in a horizontal NPN configuration, the p-type region may correspond to the first body region 108, and the n-type region may correspond to the first region 104 and to the second region 106. The forward bias voltage may be a voltage that enables holes in the p-type region and electrons in the n-type region to be "pushed" towards a junction (e.g., a p-n junction) coupling the p-type region and the n-type region. Thus, the forward bias voltage may reduce a depletion region of a p-n junction and enable bipolar current (e.g., holes and electrons) flow. Thus, biasing the first terminal 112 such that the absolute value of the body-to-source voltage is greater than the forward bias voltage (e.g., the junction voltage ($V_j$)) may enable bipolar current flow between the n-type region and the p-type region in either a horizontal PNP type device or a horizontal NPN type device.

As explained below, in a horizontal PNP configuration of the dual mode transistor 100, biasing the first terminal 112 may enable the first region 104 to operate in a substantially similar manner as an emitter of a BJT and may enable the second region 106 to operate in a substantially similar manner as a collector of a BJT. Alternatively, in a horizontal NPN configuration of the dual mode transistor 100, biasing the first terminal 112 may enable the first region 104 to operate in a substantially similar manner as a collector a BJT and may enable the second region 106 to operate in a substantially similar manner as an emitter of a BJT. Thus, a bipolar current (electrons and holes) according to a BJT-type operation may flow between the first region 104 and the second region 106 in response to biasing the first terminal 112 to the second voltage ($V_2$), and the first terminal 112 current may tune the current flow between the first region 104 and the second region 106.

In a first particular embodiment, the dual mode transistor 100 may have a PMOS and a horizontal PNP type configuration. For example, the first region 104 and the second region 106 may be doped with a P+ concentration, and the first body region 108 may be doped with an N− concentration. Thus, in the horizontal PNP type configuration, the dual mode transistor 100 may have a p-type emitter 104 and collector 106, and may have a N-type base 108 (e.g., a PNP bipolar transistor (PBJT)). The first terminal 112 may be doped with an N+ concentration, the second terminal 114 may be doped with a P+ concentration, and the substrate region 110 may be doped with a P− concentration. The first gate region 102 may include a P Metal (e.g., a metal with p-type characteristics) or may be doped with a P+ concentration (e.g., a P-Gate PFET). Alternatively, the first gate region 102 may include an N Metal (e.g., a metal with n-type characteristics) or may be doped with an N+ concentration (e.g., an N-Gate PFET).

During operation of the horizontal PNP type configuration, the first gate region 102 may be biased such that a gate voltage (e.g., the first voltage ($V_1$)) of the dual mode transistor 100 is lower than the source voltage ($V_s$) of the dual mode transistor 100. For example, a supply voltage ($V_{dd}$) may be applied to the first region 104 (e.g., the source), and the first voltage ($V_1$) is applied to the first gate region 102. Thus, the first voltage ($V_1$) may range from ground (e.g., zero volts) to the supply voltage ($V_{dd}$) such that the gate voltage is lower than the source voltage ($V_s$). Biasing the first gate region 102 with the first voltage ($V_1$) may enable P-type channel formation (e.g., formation of a P-type inversion layer) within the first body region 108 between the first region 104 and the second region 106. A unipolar current (e.g., holes) according to a PFET operation may flow from the first region 104 to the second region 106.

The first terminal 112 may be biased to a second voltage ($V_2$) such that an absolute value of a body-to-source voltage is greater than a junction voltage ($V_j$) of the dual mode transistor 100. For example, the second voltage ($V_2$) may be less than a difference of the supply voltage ($V_{dd}$) applied to the first region 104 and the junction voltage ($V_j$) (e.g., $V_2 < V_{dd} - V_j$). In a particular embodiment, the second voltage ($V_2$) applied to the first terminal 112 (coupled to the first body region 108) may be biased to a voltage that is less than a negative forward junction voltage (e.g., −0.7 V) of the dual mode transistor 100. Biasing the first terminal 112 with the second voltage ($V_2$) may enable the dual mode transistor 100 to operate according to a horizontal PNP BJT. For example, the first body region 108 may operate in a substantially similar manner as a base of a BJT, the first region 104 may operate in a substantially similar manner as an emitter (e.g., forward bias) of a BJT, and the second region 106 may operate in a substantially similar manner as a collector (e.g., reverse bias) of a BJT.

The PNP BJT may operate as a current-controlled current regulator. For example, a collector current $I_C$ (e.g., a controlled current by a base current) may flow to the second region 106 (e.g., the collector) from the first region 104 (e.g., the emitter). A base current $I_B$ (e.g., a base controlling current) may flow to the first body region 108 (e.g., the base) from the first region 104 (e.g., the emitter), and the base current $I_B$ may control an amount of collector current $I_C$. For example, the base current $I_B$ "turns on" the PNP BJT when an absolute value of the body-to-source voltage is greater than the junction voltage ($V_j$), and the base current $I_B$ enables an amount collector current $I_C$ to flow that is proportional to the base current $I_B$. Electrons may flow from the first body region 108 to the first region 104, and holes may flow from the first region 104 to the second region 106.

Thus, in the PNP configuration, a bipolar current (e.g., holes and electrons) and a unipolar current (e.g., holes) may concurrently flow between the first region 104 and the second region 106. The bipolar current may be associated with a BJT operation, and the unipolar current may be associated with the FET operation. During concurrent bipolar and unipolar operation, the first gate region 102 may control a current gain (beta) of the dual mode transistor 100's horizontal PNP, a transconductance of the dual mode transistor 100, and a resistance of the dual mode transistor 100. For example, the gate voltage (e.g., the first voltage ($V_1$)) may be selectively decreased to enable increased holes (e.g., unipolar current) to flow between the first region 104 and the second region 106. The resistance of the dual mode transistor 100 may be proportional to current and voltage applied to the dual mode transistor 100.

In a second particular embodiment, the dual mode transistor 100 may have a NMOS type configuration. For example, the first region 104 and the second region 106 may be doped with an N+ concentration, and the first body region 108 may be doped with a P− concentration. Thus, in the NMOS type configuration, the dual mode transistor 100 may be an n-type metal oxide semiconductor (NMOS) transistor (e.g., an n-type field effect transistor (NFET). The first terminal 112 may be doped with a P+ concentration, the second terminal 114 may be doped with an N+ concentration, and the substrate region 110 may be doped with a P− concentration. In the horizontal NPN type configuration, the dual mode transistor 100 may also include a second body region (not shown) between the first body region 108 and the substrate region 110. The second body region may be doped with an N− concentration (deep Nwell) and may be coupled to the second terminal 114. The first gate region 102 may include a P Metal or may be doped with a P+ concentration (e.g., a P-Gate NFET). Alternatively, the first gate region 102 may include an N Metal or may be doped with an N+ concentration (e.g., an N-Gate NFET).

During operation of the horizontal NPN type configuration, the first gate region 102 may be biased such that a gate voltage of the dual mode transistor 100 is greater than a source voltage of the dual mode transistor 100. For example, a ground voltage (e.g., zero volts) may be applied to the second region 106 (e.g., the source), and the first voltage ($V_1$) is applied to the first gate region 102. Thus, the first voltage ($V_1$) may range from ground to the supply voltage ($V_{dd}$) such that the first voltage ($V_1$) is greater than the source voltage. Biasing the first gate region 102 with the first voltage ($V_1$) may enable N type channel formation (e.g., formation of an inversion N-type layer) within the first body region 108 between the first region 104 and the second region 106. A unipolar current (e.g., electrons) according to an NFET operation may flow from the first region 104 to the second region 106.

The first terminal 112 may be biased to a second voltage ($V_2$) such that an absolute value of a body-to-source voltage is greater than a junction voltage ($V_j$) of the dual mode transistor 100. For example, the second voltage ($V_2$) may be greater than the junction voltage ($V_j$) (e.g., $V_2 > V_j$). In a particular embodiment, the second voltage ($V_2$) applied to the first terminal 112 (coupled to the first body region 108) may be biased to a voltage that is greater than a forward junction voltage (e.g., 0.7 V) of the dual mode transistor 100. Biasing the first terminal 112 with the second voltage ($V_2$) may enable the dual mode transistor 100 to operate according to an NPN BJT. For example, the first body region 108 may operate in a substantially similar manner as a base of a BJT, the first region 104 may operate in a substantially similar manner as a collector (e.g., reverse bias) of a BJT, and the second region 106 may operate in a substantially similar manner as an emitter (e.g., forward bias) of a BJT.

The NPN BJT may operate as a current-controlled current regulator. For example, a collector current $I_C$ (e.g., a controlled current by a base current) may flow to the second region 106 (e.g., the emitter) from the first region 104 (e.g., the collector). A base current $I_B$ (e.g., a controlling current) may flow to the second region 106 (e.g., the emitter) from the first body region 108 (e.g., the base), and the base current $I_B$ may control an amount of collector current $I_C$. For example, the base current $I_B$ "turns on" the PNP BJT when the body-to-source voltage is greater than the junction voltage ($V_j$), and the base current $I_B$ enables an amount of collector current $I_C$ to flow that is proportional to the base current $I_B$. Holes may flow from the first body region 108 to the second region 106, and electrons may flow from the second region 106 to the first region 104.

Thus, in the NPN configuration, a bipolar current (e.g., holes and electrons) and a unipolar current (e.g., electrons) may concurrently flow between the first region 104 and the second region 106. The bipolar current may be associated with a BJT operation, and the unipolar current may be associated with the FET operation. During concurrent bipolar and unipolar operation, the first gate region 102 may control a current gain (beta) of the dual mode transistor 100, a transconductance of the dual mode transistor 100, and a resistance of the dual mode transistor 100. For example, the gate voltage (e.g., the first voltage ($V_1$)) may be selectively increased to enable increased electrons (e.g., unipolar current) to flow between the first region 104 and the second region 106. The resistance of the dual mode transistor 100 may be proportional to current and voltage applied to the dual mode transistor 100.

Biasing the first terminal 112 may enable a concurrent digital MOS operation mode (e.g., a unipolar operation mode) and an analog gate control BJT operation mode (e.g., bipolar operation mode). Thus, a gate controlled horizontal NPN operation and an increased current, based on the unipolar current and the bipolar current, may flow through the dual mode transistor 100 without increasing a supply voltage ($V_{dd}$) applied to the dual mode transistor 100. Increasing the current without increasing the supply voltage ($V_{dd}$) provides increased operation efficiency and provides a gate controlled bipolar NPN transistor for high performance analog and RF application. It will be appreciated that in other embodiments, the techniques described with respect to the dual mode transistor 100 may be implemented in other transistor configurations. For example, in the illustrative embodiment, the dual mode transistor 100 may correspond to a planar CMOS transistor and a BJT device. In another particular embodiment, the dual mode transistor 100 may correspond to a three dimensional fin-type field-effect transistor (3D Finfet) CMOS and a BJT device.

Referring to FIG. 2, particular illustrative tables 200, 210 corresponding to biasing characteristics for a dual mode transistor are shown. For example, the biasing characteristics (e.g., voltages) illustrated in the first table 200 and the second table 210 may correspond to biasing characteristics for the dual mode transistor 100 of FIG. 1. The first table 200 may correspond to biasing characteristics as described with respect to the PNP type configuration of the dual mode transistor 100. The second table 210 may correspond to biasing characteristics as described with respect to the NPN type configuration of the dual mode transistor 100.

According to the PNP type configuration (e.g., the first table 200), the first voltage ($V_1$) applied to the first gate region 102 may be biased between ground (e.g., zero volts) and the supply voltage ($V_{dd}$). For example, the first voltage ($V_1$) may be applied such that a gate-to-source voltage ($V_{GS}$) of the dual mode transistor 100 enables channel formation (e.g., formation of a P type inversion layer) within the first body region 108 between the first region 104 and the second region 106. A unipolar current (e.g., holes) according to a FET operation may flow from the first region 104 to the second region 106. The first voltage ($V_1$) may be adjusted between ground and the supply voltage ($V_{dd}$) to adjust (e.g., enlarge) a current gain (beta) of the dual mode transistor 100, a transconductance of the dual mode transistor 100, and a resistance of the dual mode transistor 100 when the second voltage ($V_2$) turns on the horizontal PNP.

The drain voltage ($V_d$) applied to the second region 106 (e.g., the drain) may be biased to ground. The source voltage ($V_s$) applied to the first region 104 (e.g., the source) may be biased to the supply voltage ($V_{dd}$). The second voltage ($V_2$) applied to the first terminal 112 (coupled to the first body region 108) may be biased to a voltage that is less than a negative forward junction voltage (e.g., −0.7 V) of the dual mode transistor 100. For example, the second voltage ($V_2$) may be less than a difference of the supply voltage ($V_{dd}$) applied to the first region 104 and the junction voltage ($V_j$) (e.g., $V_2 < V_{dd} - V_j$). Electrons may flow from the first body region 108 to the first region 104, and holes may flow from the first region 104 to the second region 106. Thus, in the PNP configuration, a bipolar current (e.g., holes and electrons) and unipolar current may be generated. The bipolar current may be associated with a BJT operation, and the unipolar current may be associated with a FET operation.

According to the NPN type configuration (e.g., the second table 210), the first voltage ($V_1$) applied to the first gate region 102 may be biased between the supply voltage ($V_{dd}$) and ground (e.g., zero volts). For example, the first voltage ($V_1$) may be applied such that a gate-to-source voltage ($V_{GS}$) of the dual mode transistor 100 enables channel formation (e.g., formation of an N type inversion layer) within the first body region 108 between the first region 104 and the second region 106. A unipolar current (e.g., electrons) according to a FET operation may flow to the first region 104 from the second region 106. The first voltage (V1) may be adjusted between ground and the supply voltage ($V_{dd}$) to adjust (e.g., enlarge) a current gain (beta) of the dual mode transistor 100, a transconductance of the dual mode transistor 100, and a resistance of the dual mode transistor 100 when the second voltage ($V_2$) turns on the horizontal NPN.

The drain voltage ($V_d$) applied to the first region 104 (e.g., the drain) may be biased to the supply voltage ($V_{dd}$). The source voltage ($V_s$) applied to the second region 106 (e.g., the source) may be biased to ground. The second voltage ($V_2$) applied to the first terminal 112 (coupled to the first body region 108) may be biased to a voltage that is greater than a forward junction voltage (e.g., 0.7 V) of the dual mode transistor 100. For example, the second voltage ($V_2$) may be greater than a difference of the junction voltage ($V_j$) and the ground voltage applied to the second region 106 (e.g., $V_2 > V_j$). Holes may flow from the first body region 108 to the second region 106, and electrons may flow from the second region 106 to the first region 104. Thus in the NPN configuration, a bipolar current (e.g., holes and electrons) according to a BJT operation may be generated.

The tables 200, 210 depicted in FIG. 2 include non-limiting examples of biasing characteristics for the dual mode transistor 100 of FIG. 1. For example, the tables 200, 210 illustrate that a unipolar current and a bipolar current may be generated concurrently by biasing the first terminal 112 with the second voltage ($V_2$) such that an absolute value of the body-to-source voltage is greater than a junction voltage ($V_j$) of the dual mode transistor 100. It will be appreciated that other (e.g., different) characteristics and/or configurations may be implemented with respect to other embodiments. Biasing the first terminal 112 with the second voltage ($V_2$) may enable the dual mode transistor 100 to operate according to a PNP BJT or a NPN BJT. Biasing the first gate region 102 with the first voltage ($V_1$) may enable the dual mode transistor 100 to operate according to a FET. Thus, the dual mode transistor 100 may concurrently operate in a digital MOS mode (e.g., a unipolar operation mode) and an analog gate control BJT mode (e.g., bipolar operation mode).

Figure 3:
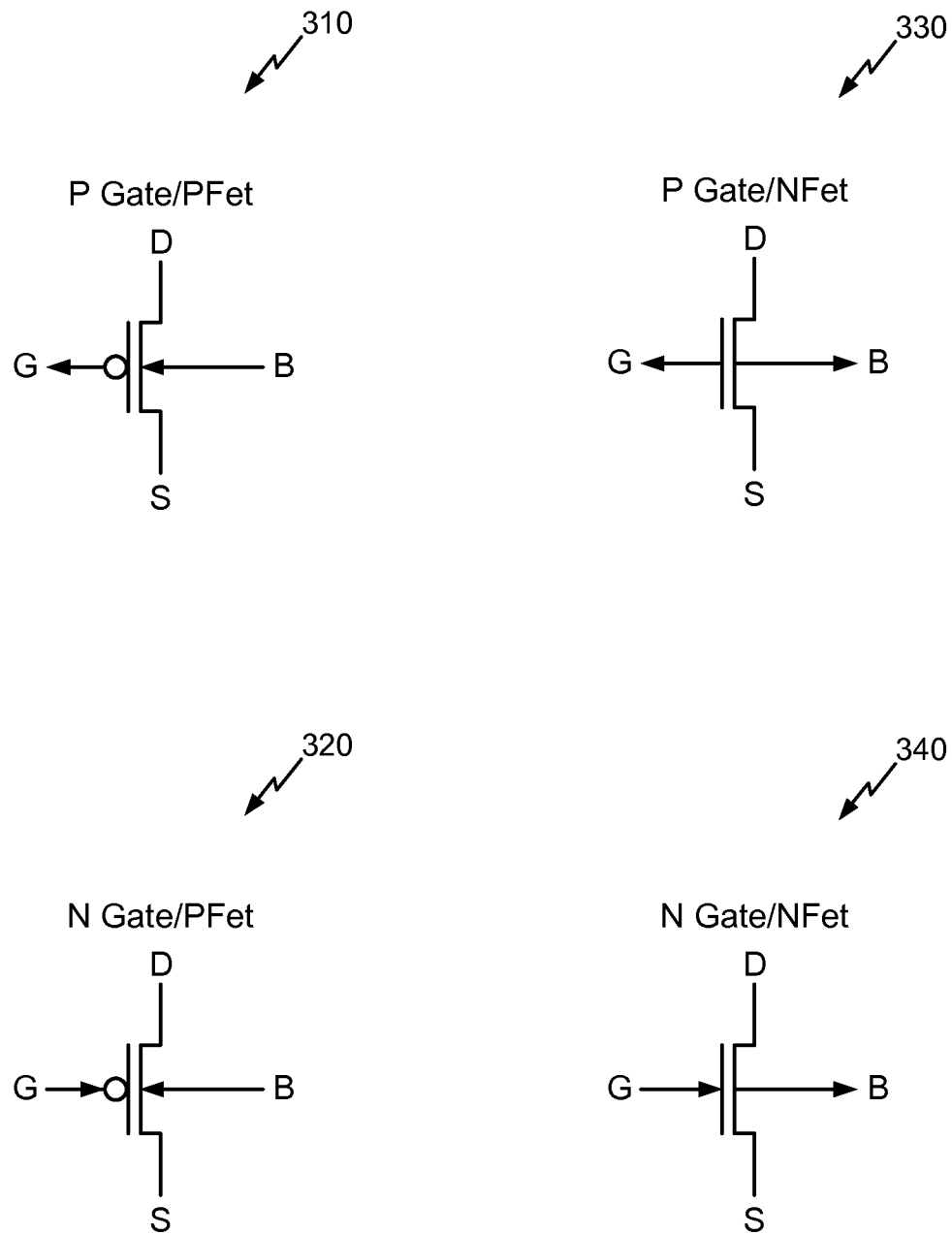
FIG. 3 depicts particular illustrative embodiments of field effect transistor (FET)-type configurations of a dual mode transistor.

Referring to FIG. 3, particular illustrative embodiments of field effect transistor (FET)-type configurations of a dual mode transistor are shown. A first embodiment 310 and a second embodiment 320 illustrate p-type FET (PFET) configurations of a dual mode transistor. A third embodiment 330 and a fourth embodiment 340 illustrate n-type FET (NFET) configurations of a dual mode transistor. Each embodiment 310-340 may correspond to the dual mode transistor 100 of FIG. 1.

According to the first embodiment 310, the PFET configuration may include a gate that is doped with a P+ concentration or a gate that includes a P-Metal. The first embodiment 310 may enable a digital complementary metal oxide semiconductor (CMOS) mode. For example, the first embodiment 310 may enable a unipolar current (e.g., holes) to flow from a source terminal (S) to drain terminal (D). To enable the digital CMOS mode, the absolute value of a gate-to-source voltage should be larger than an absolute threshold voltage (e.g., $|V_g - V_s| > |V_t|$). The drain voltage ($V_d$) should be grounded, and a source voltage (Vs) should be approximately equal to a supply voltage ($V_{dd}$). In addition, the voltage applied to the body region should be approximately equal to a supply voltage ($V_{dd}$).

According to the second embodiment 320, the PFET configuration may include a gate that is doped with an N+ concentration or a gate that includes an N-Metal. The second embodiment 320 may enable a digital CMOS mode. For example, the second embodiment 320 may enable a unipolar current (e.g., holes) to flow from a source terminal (S) to drain terminal (D). To enable the digital CMOS mode, the absolute value of a gate-to-source voltage should be larger than an absolute threshold voltage (e.g., $|V_g-V_s|>|V_t|$. The drain voltage ($V_d$) should be grounded, and a source voltage (Vs) should be approximately equal to a supply voltage ($V_{dd}$). In addition, the voltage applied to the body region should be approximately equal to a supply voltage ($V_{dd}$).

According to the third embodiment 330, the NFET configuration may include a gate that is doped with a P+ concentration or a gate that includes a P-Metal. The third embodiment 330 may also enable a digital CMOS mode. For example, the third embodiment 330 may enable a unipolar current (e.g., electrons) to flow from a source terminal (S) to drain terminal (D). To enable the digital CMOS mode, the absolute value of a gate-to-source voltage should be larger than an absolute threshold voltage (e.g., $|V_g-V_s|>|V_t|$). The drain voltage ($V_d$) should be approximately equal to a supply voltage ($V_{dd}$), and a source voltage (Vs) should be grounded (e.g., zero volts). In addition, the voltage applied to the body region should be grounded.

According to the fourth embodiment 340, the NFET configuration may include a gate that is doped with an N+ concentration or a gate that includes an N-Metal. The fourth embodiment 340 may also enable a digital CMOS mode. For example, the fourth embodiment 340 may enable a unipolar current (e.g., electrons) to flow from a source terminal (S) to drain terminal (D). To enable the digital CMOS mode, the absolute value of a gate-to-source voltage should be larger than an absolute threshold voltage (e.g., $|V_g-V_s|>|V_t|$). The drain voltage ($V_d$) should be approximately equal to a supply voltage ($V_{dd}$), and a source voltage (Vs) should be grounded (e.g., zero volts). In addition, the voltage applied to the body region should be grounded.

Figure 4:
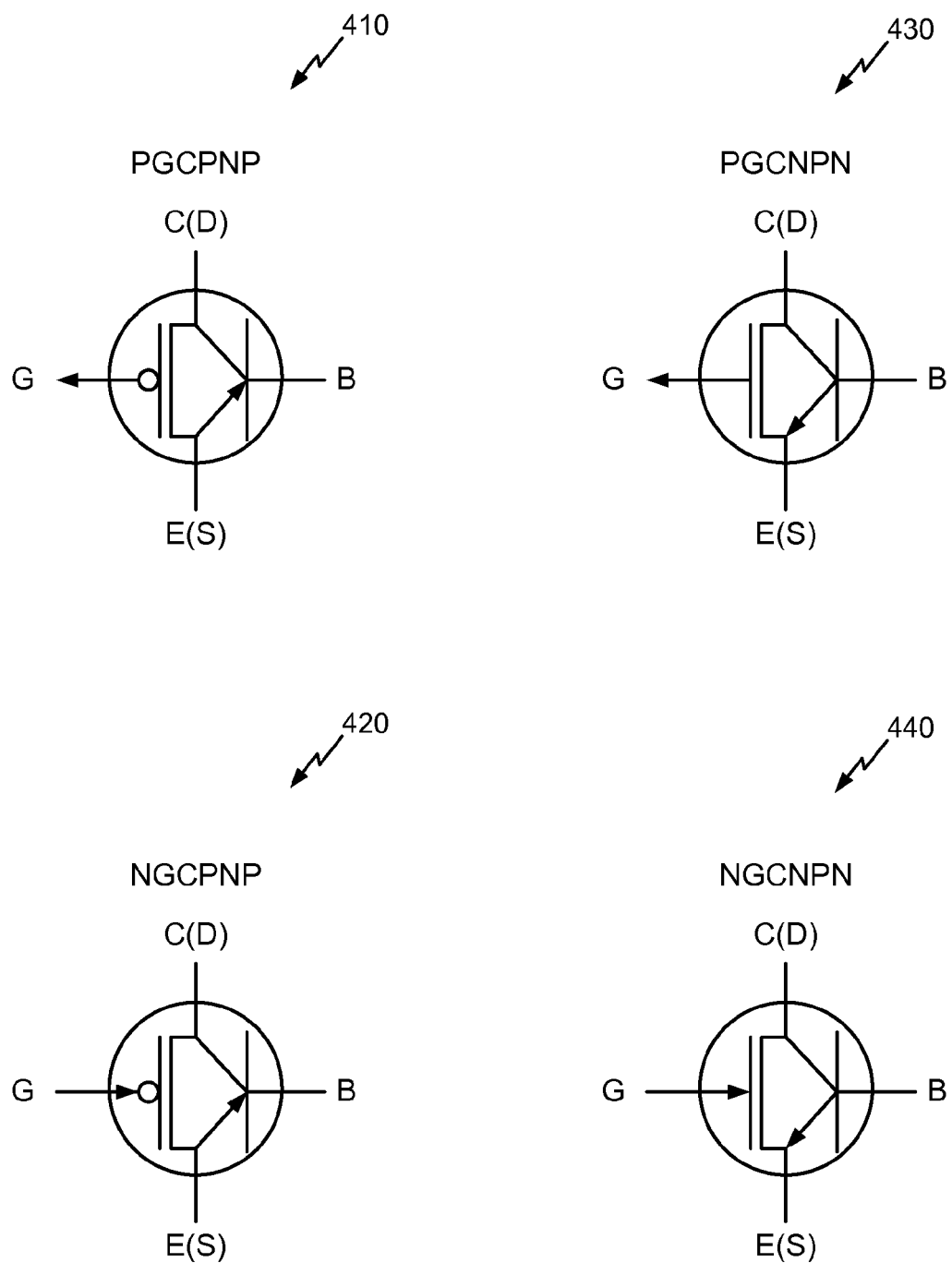
FIG. 4 depicts particular illustrative embodiments of bipolar junction transistor (BJT)-type configurations of a dual mode transistor.

Referring to FIG. 4, particular illustrative embodiments of binary junction transistor (BJT)-type configurations of a dual mode transistor are shown. A first embodiment 410 and a second embodiment 420 illustrate PNP configurations of a dual mode transistor. The first embodiment 410 may operate in conjunction with the first embodiment 310 of FIG. 3, and the second embodiment 420 may operate in conjunction with the second embodiment 320 of FIG. 3. A third embodiment 430 and a fourth embodiment 440 illustrate NPN configurations of a dual mode transistor. The third embodiment 430 may operate in conjunction with the third embodiment 330 of FIG. 3, and the fourth embodiment 440 may operate in conjunction with the fourth embodiment 340 of FIG. 3. Each embodiment 410-440 may correspond to the dual mode transistor 100 of FIG. 1.

According to the first embodiment 410, the PNP configuration may include a gate that is doped with a P+ concentration or a gate that includes a P-Metal. The first embodiment 410 may enable an analog gate control bipolar junction transistor (BJT) mode. For example, the first embodiment 410 may enable a bipolar current (e.g., holes and electrons). For example, holes may flow from an emitter terminal (E) to a collector terminal (C), and electrons may flow from a base terminal (B) to the emitter terminal (E). To enable the analog gate control BJT mode, the gate-to-emitter (source) voltage should be larger than a junction (e.g., threshold) voltage (e.g., $|V_g-V_e|>|V_t|$). The emitter voltage ($V_e$) should be Vdd, and the collector voltage ($V_c$) should be approximately equal to ground. An absolute value of a base-to-emitter voltage should be larger than a junction threshold (e.g., 0.7 volts) (e.g., $|V_b-V_e|>0.7$ V).

According to the second embodiment 420, the PNP configuration may include a gate that is doped with an N+ concentration or a gate that includes an N-Metal. The second embodiment 420 may also enable an analog gate control BJT mode. For example, the second embodiment 420 may enable a bipolar current (e.g., holes and electrons). For example, holes may flow from an emitter terminal (E) to a collector terminal (C), and electrons may flow from a base terminal (B) to the emitter terminal (E). To enable the analog gate control BJT mode, the gate-to-emitter (source) voltage should be larger than a junction (e.g., threshold) voltage (e.g., $|V_g-V_e|>|V_t|$). The emitter voltage ($V_e$) should be Vdd, and the collector voltage ($V_c$) should be approximately equal to ground. An absolute value of a base-to-emitter voltage should be larger than a junction threshold (e.g., 0.7 volts) (e.g., $|V_b-V_e|>0.7$ V).

According to the third embodiment 430, the NPN configuration may include a gate that is doped with a P+ concentration or a gate that includes a P-Metal. The third embodiment 430 may also enable an analog gate control BJT mode. For example, the third embodiment 430 may enable a bipolar current (e.g., holes and electrons). For example, holes may flow from a base terminal (B) to an emitter terminal (E), and electrons may flow from the emitter terminal (E) to a collector terminal (C). To enable the analog gate control BJT mode, the gate-to-emitter (source) voltage should be larger than a junction (e.g., threshold) voltage (e.g., $V_g-V_e>V_t$). The emitter voltage ($V_e$) should be approximately equal to ground, and the collector voltage ($V_c$) should be Vdd. An absolute value of a base-to-emitter voltage should be larger than a junction threshold (e.g., 0.7 volts) (e.g., $|V_b-V_e|>0.7$ V).

According to the fourth embodiment 440, the NPN configuration may include a gate that is doped with an N+ concentration or a gate that includes an N-Metal. The fourth embodiment 440 may also enable an analog gate control BJT mode. For example, the fourth embodiment 440 may enable a bipolar current (e.g., holes and electrons). For example, holes may flow from a base terminal (B) to an emitter terminal (E), and electrons may flow from the emitter terminal (E) to a collector terminal (C). To enable the analog gate control BJT mode, the gate-to-emitter (source) voltage should be larger than a junction (e.g., threshold) voltage (e.g., $V_g-V_e>V_t$). The emitter voltage ($V_e$) should be approximately equal to ground, and the collector voltage ($V_c$) should be Vdd. An absolute value of a base-to-emitter voltage should be larger than a junction threshold (e.g., 0.7 volts) (e.g., $|V_b-V_e|>0.7$ V).

Figure 5:
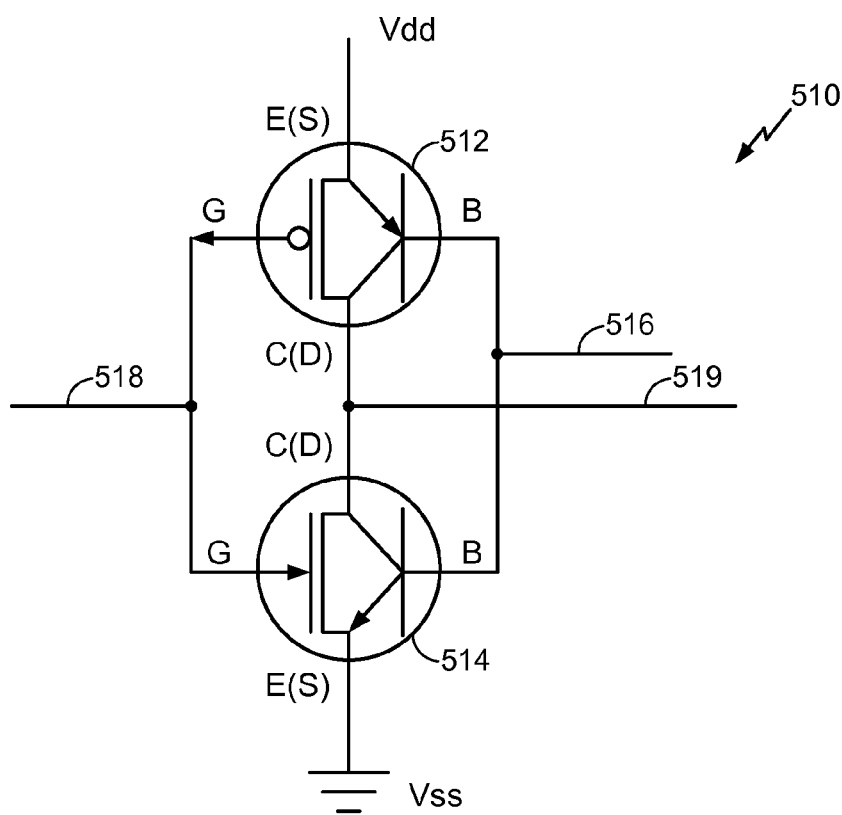
FIG. 5 depicts particular illustrative embodiments of an inverter mixer that includes dual mode transistors.
Figure 5:
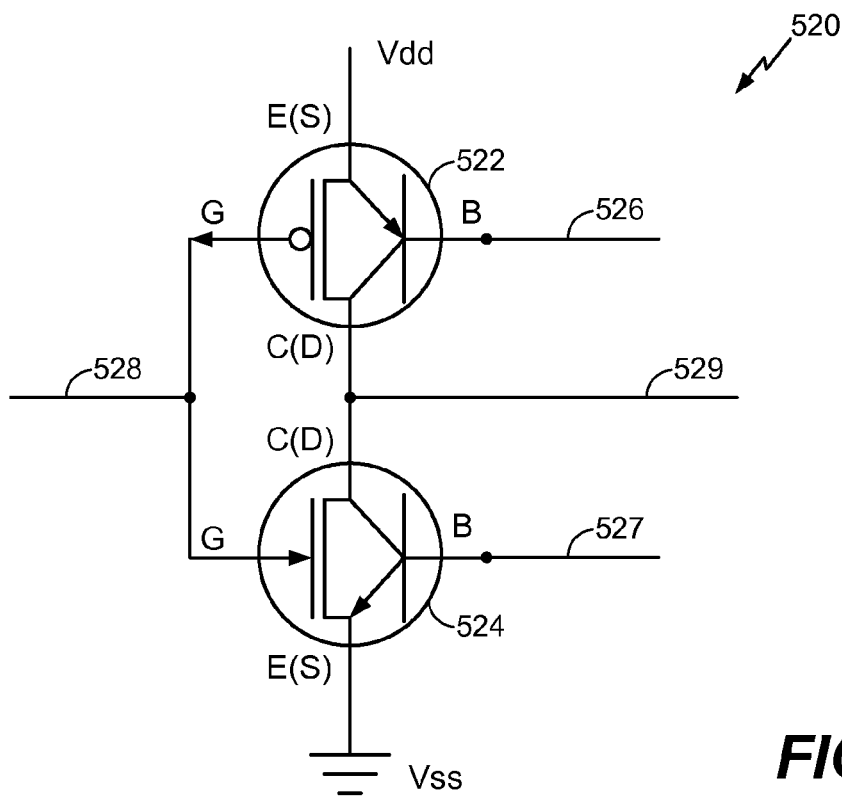

Referring to FIG. 5, particular illustrative embodiments 510, 520 of an inverter mixer that includes dual mode transistors are shown.

A first embodiment 510 of the inverter mixer includes a first dual mode transistor 512 and a second dual mode transistor 514. In a particular embodiment, the first dual mode transistor 512 and the second dual mode transistor 514 may each correspond to the dual mode transistor 100 of FIG. 1. Alternatively, or in addition, the first dual mode transistor 512 and the second dual mode transistor 514 may each correspond to any of the embodiments 310-340 of FIG. 3 and the corresponding embodiments 410-440 of FIG. 4.

In the first embodiment 510, a first body region of the first dual mode transistor 512 may be coupled to a second body region of the second dual mode transistor 514. The first body region and the second body region may also be coupled to receive a first input signal 516. The first input signal 516 may correspond to a local oscillator (LO) signal. A first gate of the first dual mode transistor 512 may be coupled to a second gate of the second dual mode transistor 514. The first gate and the second gate may also be coupled to receive a second input signal 518. The second input signal 518 may correspond to a radio frequency (RF) signal.

A first source (e.g., a first emitter) of the first dual mode transistor 512 may be coupled to receive a supply voltage ($V_{dd}$), and a second source (e.g., a second emitter) of the second dual mode transistor 514 may be coupled to ground ($V_{ss}$). A first drain (e.g., a first collector) of the first dual mode transistor 512 may be coupled to a second drain (e.g., a second collector) of the second dual mode transistor 514. The first drain and the second drain may generate an output signal 519. The output signal 519 may correspond to a sum of the RF signal and the LO signal.

The first dual mode transistor 512 may be a PMOS (PNP) transistor, and the second dual mode transistor 514 may be an NMOS (NPN) transistor. The first embodiment 510 may invert the second input signal 518 (e.g., the RF signal) and mix the inverted second input signal with the first input signal 516 (e.g., the LO signal) applied to the first body region. For example, when the second input signal 518 has a logic low voltage level, the first dual mode transistor 512 may be activated and a RF signal (e.g., 518) is inverted from the second input signal 518 to output 519 according to concurrent bipolar and unipolar operation, as described above. For example, the logic low voltage level of the second input signal 518 may enable a unipolar current (e.g., holes) to flow from the first source to the first drain and tuned by the second input signal 518, and the first input signal 516 (having a logic voltage level that is less than a negative forward junction voltage ($V_j$) of the first dual mode transistor 512) may enable a bipolar current to flow and tuned by the first input signal 516.

Alternatively, when the second input signal 518 has a logic high voltage level, the second dual mode transistor 514 may be activated and a RF signal (e.g., 518) is inverted from the second input signal 518 to output 519 according to concurrent bipolar and unipolar operation, as described above. For example, the logic high voltage level of the second input signal 518 may enable a unipolar current (e.g., electrons) to flow from the second source to the second drain and tuned by the second input signal 518, and the first input signal 516 (having a logic voltage level that is greater than a forward junction voltage ($V_j$) of the second dual mode transistor 514) may enable a bipolar current to flow and tuned by the first input signal 516.

A second embodiment 520 of the inverter mixer includes a first dual mode transistor 522 and a second dual mode transistor 524. In a particular embodiment, the first dual mode transistor 522 and the second dual mode transistor 524 may each correspond to the dual mode transistor 100 of FIG. 1. Alternatively, or in addition, the first dual mode transistor 522 and the second dual mode transistor 524 may each correspond to any of the embodiments 310-340 of FIG. 3 and the corresponding embodiments 410-440 of FIG. 4.

In the second embodiment 520, a first body region of the first dual mode transistor 522 may be coupled to receive a first input signal 516. The first input signal 526 may be a first LO signal having a voltage ranging approximately from a relatively high range (e.g., 0.4 V to 1.5 V). A second body region of the second dual mode transistor 524 may be coupled to receive a second input signal 527. The second input signal 527 may be a second LO signal having a voltage ranging approximately from a relatively low range (e.g., 0 V to 1.2 V). A first gate of the first dual mode transistor 522 may be coupled to a second gate of the second dual mode transistor 524. The first gate and the second gate may also be coupled to receive a third input signal 528. The third input signal 528 may correspond to an RF signal.

A first source (e.g., a first emitter) of the first dual mode transistor 522 may be coupled to receive a supply voltage ($V_{dd}$), and a second source (e.g., a second emitter) of the second dual mode transistor 524 may be coupled to ground ($V_{ss}$). A first drain (e.g., a first collector) of first dual mode transistor 522 may be coupled to a second drain (e.g., a second collector) of the second dual mode transistor 524. The first drain and the second drain may generate an output signal 529. The output signal 529 may correspond to a sum of the RF signal and the LO signals.

The first dual mode transistor 522 may be a PMOS (PNP) transistor, and the second dual mode transistor 524 may be an NMOS (NPN) transistor. The second embodiment 520 may invert the third input signal 528 (e.g., the RF signal) and mix the inverted third input signal with the first input signal 526 (e.g., the LO signal) applied to the first body region (and/or with the second input signal 527 applied to the second body region). For example, when the third input signal 528 has a logic low voltage level, the first dual mode transistor 522 may be activated and a RF signal (e.g., 528) is inverted from the third input signal 528 to output signal 529 according to concurrent bipolar and unipolar operation, as described above. For example, the logic low voltage level of the third input signal 528 may enable a unipolar current (e.g., holes) to flow from the first source to the first drain and tuned by the third input signal 528, and the first input signal 526 (having a logic voltage level that is less than a negative forward junction voltage ($V_j$) of the first dual mode transistor 522) may enable a bipolar current to flow and tuned by the first input signal 526.

Alternatively, when the third input signal 528 has a logic high voltage level, the second dual mode transistor 524 may be activated and a RF signal (e.g., 528) is inverted from the third input signal 528 to output signal 529 according to concurrent bipolar and unipolar operation, as described above. For example, the logic high voltage level of the third input signal 528 may enable a unipolar current (e.g., electrons) to flow from the second source to the second drain and tuned by the third input signal 528, and the second input signal 527 (having a logic voltage level that is greater than a forward junction voltage ($V_j$) of the second dual mode transistor 524) may enable a bipolar current to flow and tuned by the second input signal 527.

Figure 6:
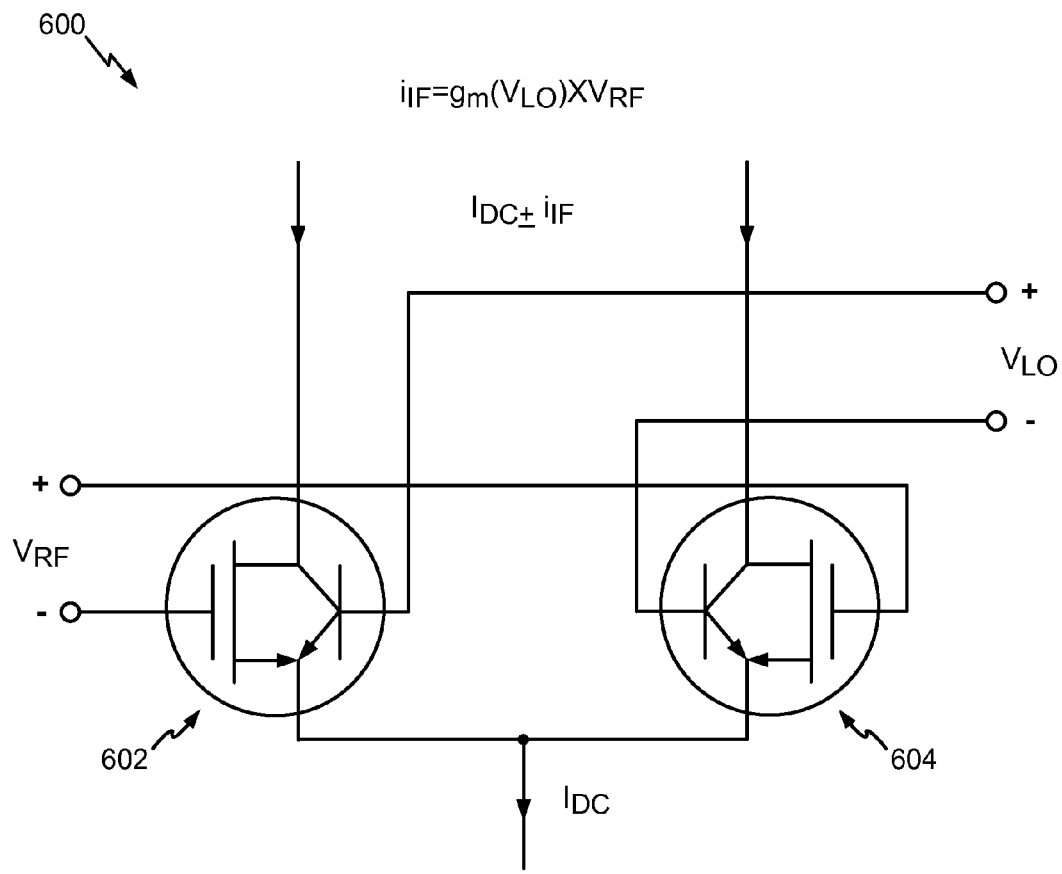
FIG. 6 is a circuit diagram of a particular illustrative embodiment of a differential mixer that includes dual mode transistors.

Referring to FIG. 6, a particular illustrative embodiment of a differential mixer 600 that includes dual mode transistors is shown. For example, the differential mixer 600 includes a first dual mode transistor 602 and a second dual mode transistor 604. In a particular embodiment, the first dual mode transistor 602 and the second dual mode transistor 604 may each correspond to the dual mode transistor 100 of FIG. 1. Alternatively, or in addition, the first dual mode transistor 602 and the second dual mode transistor 604 may each correspond to any of the embodiments 310-340 of FIG. 3 and the corresponding embodiments 410-440 of FIG. 4.

A first gate of the first dual mode transistor 602 may be coupled to receive a first signal of a first differential signal. The first differential signal may be a radio frequency (RF) signal. A second gate of the second dual mode transistor 604 may be coupled to receive a second (e.g., complementary) signal of the first differential signal. A first body region of the first dual mode transistor 602 may be coupled to receive a second signal of a second differential signal. The second differential signal may be a local oscillator (LO) signal. A second body region of the second dual mode transistor 604 may be coupled to receive a first (e.g., complementary) signal of the second differential signal.

A first source (e.g., a first emitter) of the first dual mode transistor 602 may be coupled to a second source (e.g., a second emitter) of the second dual mode transistor 604. The first drain and the second drain may generate a differential output signal. For example, the output signal may be an intermediate frequency signal.

Thus, the differential mixer 600 of FIG. 6 may include two dual mode transistors 602, 604 that are differentially driven. The differential mixer 600 may enable a relatively high native small-signal gain from NMOS and BJT modulation, which may lead to a relatively high conversion gain. Due to a single-stage operation and the relatively high conversion gain, the differential mixer 600 may generate less noise and better gain and linearity than a conventional Gilbert differential mixer (not shown). The (two transistor) dual mode differential mixer 600 reduces stages from two to one and improves delay, power efficiency and gain. For example, the differential mixer 600 has two dual mode transistors and one stage in comparison with the six traditional transistors and two stages of the Gilbert differential mixer. The differential mixer 600 may also operate in a lower power mode and may enable single direct-current (DC) bias for mixing operations.

Figure 7:
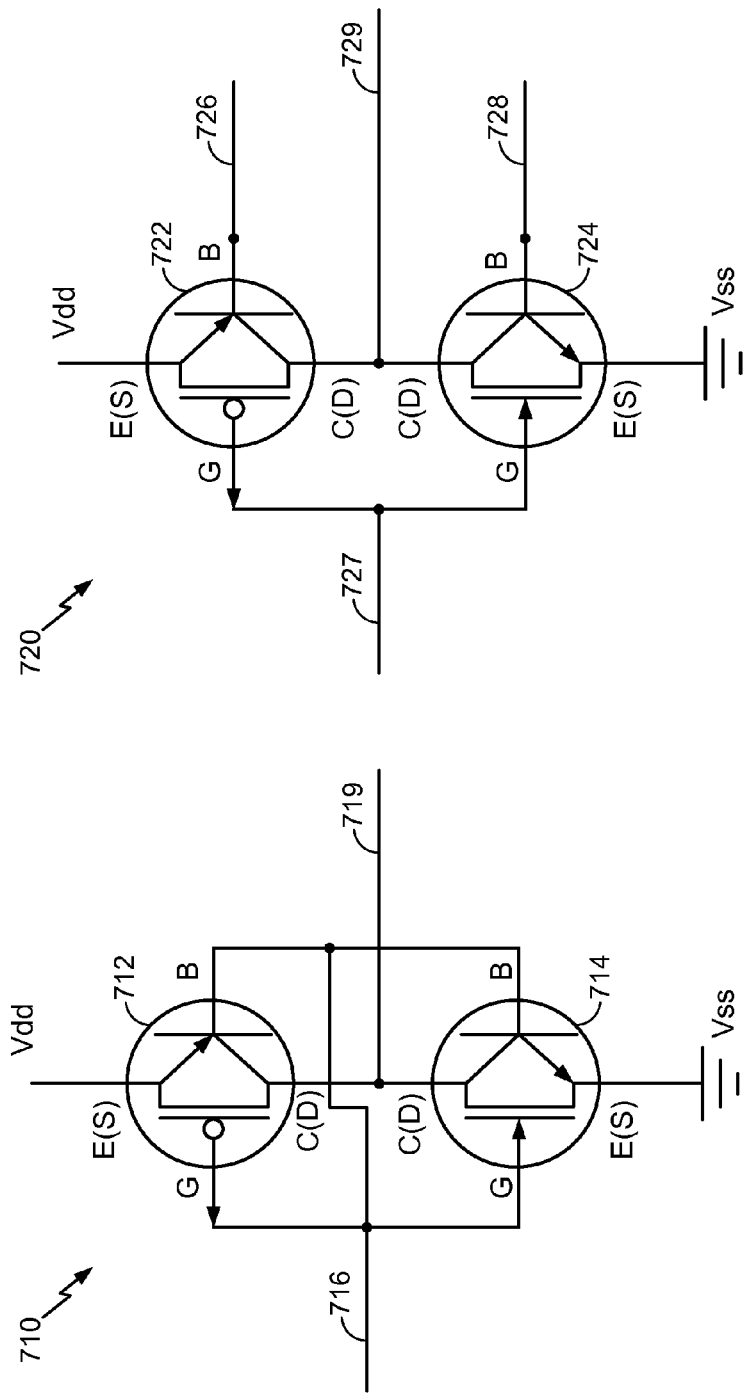
FIG. 7 depicts particular illustrative embodiments of an inverter driver that includes dual mode transistors.

Referring to FIG. 7, particular illustrative embodiments 710, 720 of an inverter driver that includes dual mode transistors are shown. A first embodiment 710 of the inverter driver includes a first dual mode transistor 712 and a second dual mode transistor 714.

In a particular embodiment, the first dual mode transistor 712 and the second dual mode transistor 714 may each correspond to the dual mode transistor 100 of FIG. 1. Alternatively, or in addition, the first dual mode transistor 712 and the second dual mode transistor 714 may each correspond to any of the embodiments 310-340 of FIG. 3 and the corresponding embodiments 410-440 of FIG. 4.

In the first embodiment 710, a first body region of the first dual mode transistor 712 may be coupled to a second body region of the second dual mode transistor 714. The first body region and the second body region may also be coupled to receive a first input signal 716. A first gate of the first dual mode transistor 712 may be coupled to a second gate of the second dual mode transistor 714. The first gate and the second gate may also be coupled to receive the first input signal 516.

A first source (e.g., a first emitter) of the first dual mode transistor 712 may be coupled to receive a supply voltage ($V_{dd}$), and a second source (e.g., a second emitter) of the second dual mode transistor 714 may be coupled to ground ($V_{ss}$). A first drain (e.g., a first collector) of first dual mode transistor 712 may be coupled to a second drain (e.g., a second collector) of the second dual mode transistor 714. The first drain and the second drain may generate an output signal 719.

The first dual mode transistor 712 may be a PMOS (PNP) transistor, and the second dual mode transistor 714 may be an NMOS (NPN) transistor. The first embodiment 710 may invert the first input signal 716 and drive the inverted first input signal to an output. For example, when the first input signal 716 has a logic low voltage level, the first dual mode transistor 712 may be activated and a logic low voltage level signal (e.g., 716) is inverted from the first input signal 716 to the output signal 719 according to concurrent bipolar and unipolar operation, as described above. For example, the logic low voltage level of the first input signal 716 may enable a unipolar current (e.g., holes) to flow from the first source to the first drain and tuned by the first input signal 716. The low voltage level of the first input signal 716 may be less than a negative forward junction voltage ($V_j$) of the first dual mode transistor 712, enabling a bipolar current to flow when applied to the first body region and tuned by the first input signal 716.

Alternatively, when the first input signal 716 has a logic high voltage level, the second dual mode transistor 714 may be activated and a logic high voltage level signal (e.g., 716) is inverted from the first input signal 716 to the output signal 719 according to concurrent bipolar and unipolar operation, as described above. For example, the logic high voltage level of the first input signal 716 may enable a unipolar current (e.g., electrons) to flow from the second source to the second drain and tuned by the first input signal 716. The high voltage level of the first input signal 716 may be greater than a forward junction voltage ($V_j$) of the second dual mode transistor 714, enabling a bipolar current to flow when applied to the first body region and tuned by the first input signal 716.

A second embodiment 720 of the inverter driver includes a first dual mode transistor 722 and a second dual mode transistor 724. In a particular embodiment, the first dual mode transistor 722 and the second dual mode transistor 724 may each correspond to the dual mode transistor 100 of FIG. 1. Alternatively, or in addition, the first dual mode transistor 722 and the second dual mode transistor 724 may each correspond to any of the embodiments 310-340 of FIG. 3 and the corresponding embodiments 410-440 of FIG. 4.

In the second embodiment 720, a first body region of the first dual mode transistor 722 may be coupled to receive a first input signal 726. A first gate of the first dual mode transistor 722 may be coupled to a second gate of the second dual mode transistor 724. The first gate and the second gate may also be coupled to receive a second input signal 727. A second body region of the second dual mode transistor 724 may be coupled to receive a third input signal 728.

A first source (e.g., a first emitter) of the first dual mode transistor 722 may be coupled to receive a supply voltage ($V_{dd}$), and a second source (e.g., a second emitter) of the second dual mode transistor 724 may be coupled to ground ($V_{ss}$). A first drain (e.g., a first collector) of first dual mode transistor 722 may be coupled to a second drain (e.g., a second collector) of the second dual mode transistor 724. The first drain and the second drain may generate an output signal 729.

The first dual mode transistor 722 may be a PMOS (PNP) transistor, and the second dual mode transistor 724 may be an NMOS (NPN) transistor. The second embodiment 720 may invert the second input signal 727 and drive the inverted second input signal to an output. For example, when the second input signal 727 has a logic low voltage level, the first dual mode transistor 722 may be activated and a logic low voltage level signal (e.g., 727) is inverted from the second input signal 727 to the output signal 729 according to concurrent bipolar and unipolar operation, as described above. For example, the logic low voltage level of the second input signal 727 may enable a unipolar current (e.g., holes) to flow from the first source to the first drain and tuned by the second input signal 727. The first input signal 726 may have a logic low voltage level that is less than a negative forward junction voltage ($V_j$) of the first dual mode transistor 722, enabling a bipolar current to flow when applied to the first body region and tuned by the first input signal 726.

Alternatively, when the second input signal 727 has a logic high voltage level, the second dual mode transistor 724 may be activated and a logic high voltage level signal (e.g., 727) is inverted from the second input signal 727 to the output signal 729 according to concurrent bipolar and unipolar operation, as described above. For example, the logic high voltage level of the second input signal 727 may enable a unipolar current (e.g., electrons) to flow from the second source to the second drain. The third input signal 728 may have a logic high voltage level that is greater than a forward junction voltage ($V_j$) of the second dual mode transistor 724, enabling a bipolar current to flow when applied to the first body region and tuned by the third input signal 728.

Figure 8A:
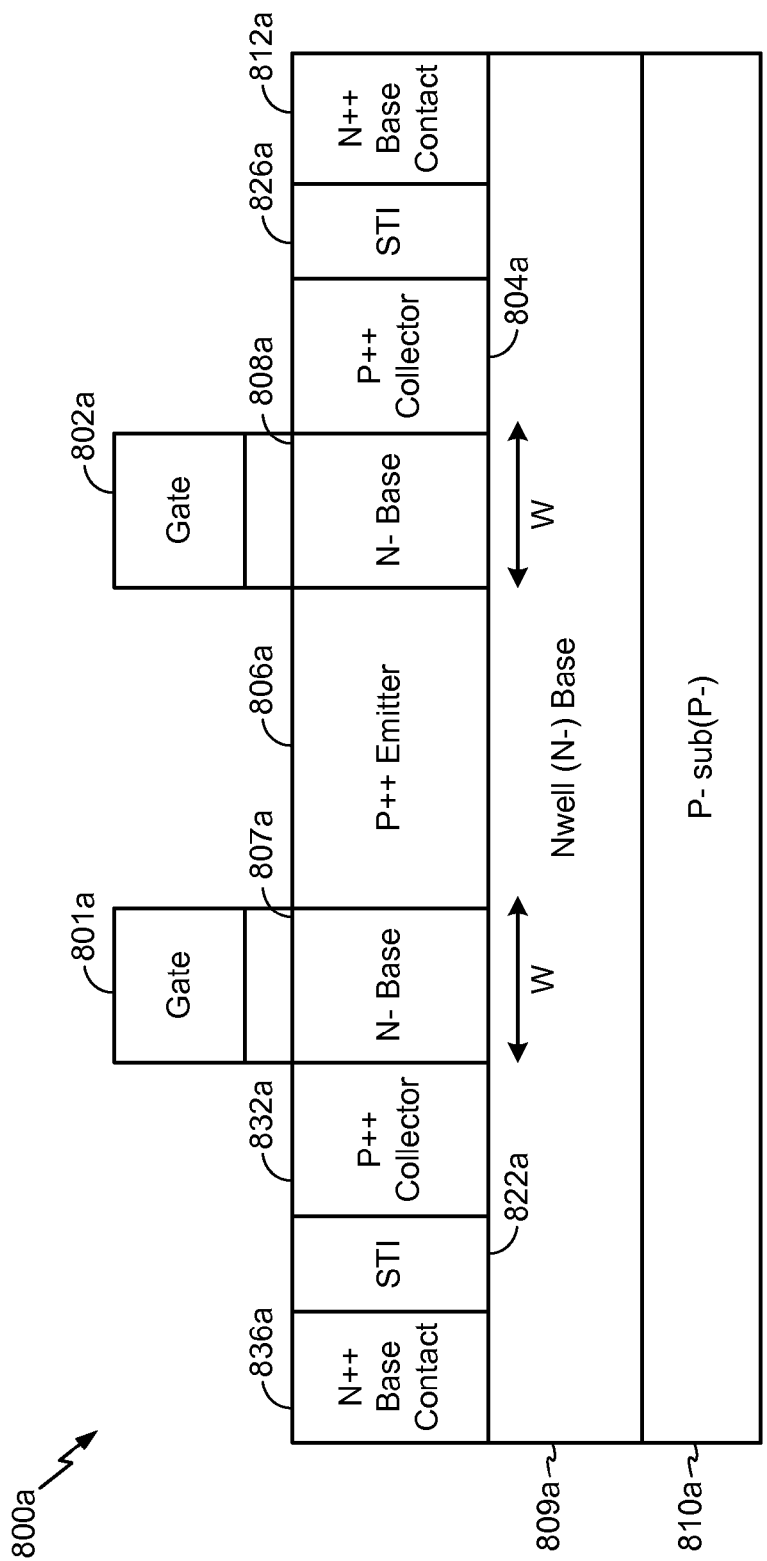
FIGS. 8a and 8b are diagrams of particular illustrative embodiments of a PNP dual mode transistor.

Referring to FIG. 8a, a particular illustrative embodiment of a PNP dual mode transistor 800a is shown. In a particular embodiment, the PNP dual mode transistor 800a may correspond to the dual mode transistor 100 of FIG. 1.

The PNP dual mode transistor 800a includes a first N− base region 807a and a second N− base region 808a. Each N− base region 807a, 808a may have a particular width (W). The first N− base region 807a and the second N− base region 808a may be coupled to (or include) an N− base well 809a. An N++ base contact 812a, 836a may also be coupled to the N− base regions 807a, 808a via the N− base well 809a. In a particular embodiment, the N++ base contact 812a, 836a may correspond to the first terminal 112 of FIG. 1. The PNP dual mode transistor 800a also includes an emitter region 806a, a first collector region 804a, and a second collector region 832a. The emitter region 806a, the first collector region 804a, and the second collector region 832a may each be doped with a P++ concentration. A first STI area 822a may prevent (or reduce) current leakage (from N++ base to P++ collector) from affecting the PNP dual mode transistor 800a. A second STI area 826a may prevent (or reduce) current leakage between the first collector region 804a and the N++ base contact 812a.

A first gate 801a may be coupled to the first N− base region 807a via a dielectric layer, and a second gate 802a may be coupled to the second N− base region 808a via a dielectric layer. A current gain of the PNP dual mode transistor 800a may be controlled by a gate voltage applied to the gates 801a, 802a. The PNP dual mode transistor 800a may also include a P− substrate 810a.

The PNP dual mode transistor 800a may operate in a digital MOS mode (e.g., a unipolar operation mode) and an analog gate control BJT mode (e.g., bipolar operation mode). For example, the gate voltages may be biased so that a gate-source-voltage enables formation of an inversion layer within the second N− base region 808a. A unipolar current (e.g., holes) may flow between the first collector region 804a, 832a and the emitter region 806a. The N++ base contact 812a, 836a may be biased such that an absolute value of a voltage difference between the N− base well 809a and the first collector region 804a, second collector 832a is greater than a forward junction voltage ($V_j$) of the PNP dual mode transistor 800a. In a particular embodiment, the N++ base contact may be biased to a voltage that is less than a negative forward junction voltage (e.g., −0.7 V) of the PNP dual mode transistor 800a. Biasing the N++ base contact may enable the PNP dual mode transistor 800a to operate according to a PNP BJT (e.g., generate a bipolar current including holes and electrons).

Figure 8B:
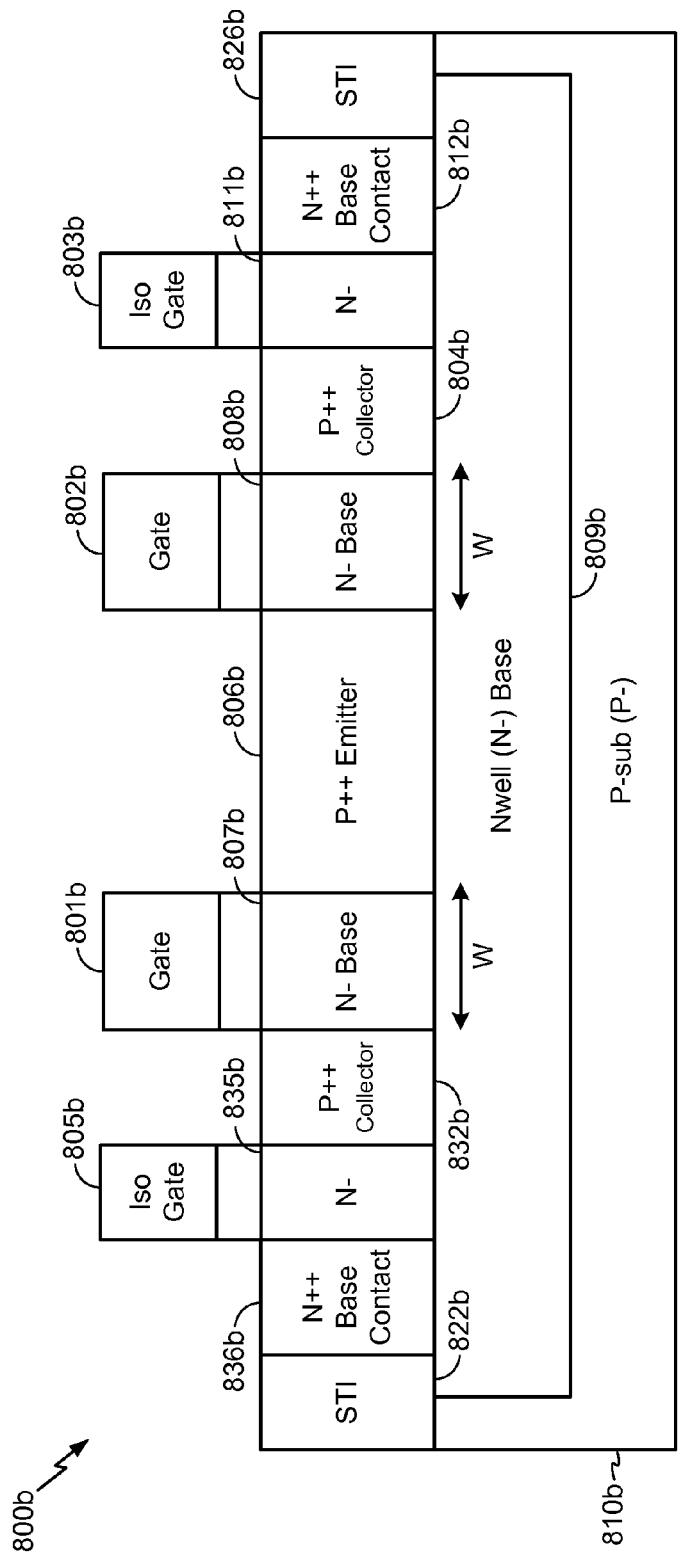

Referring to FIG. 8b, a particular illustrative embodiment of a PNP dual mode transistor 800b is shown. In a particular embodiment, the PNP dual mode transistor 800b may correspond to the dual mode transistor 100 of FIG. 1.

The PNP dual mode transistor 800b includes a first N− base region 807b and a second N− base region 808b. Each N− base region 807b, 808b may have a particular width (W). The first N− base region 807b and the second N− base region 808b may be coupled to (or include) an N− base well 809b. An N++ base contact 812b, 836b may also be coupled to the N− base regions 807b, 808b via the N− base well 809b. In a particular embodiment, the N++ base contact 812b, 836b may correspond to the first terminal 112 of FIG. 1. The PNP dual mode transistor 800b also includes an emitter region 806b, a first collector region 804b, and a second collector region 832b. The emitter region 806b, the first collector region 804b, and the second collector region 832b may each be doped with a P++ concentration. A first STI area 822b may prevent (or reduce) current leakage (from other transistors) from affecting the PNP dual mode transistor 800b. A second STI area 826b may prevent (or reduce) current leakage from other transistors.

A first gate 801b may be coupled to the first N− base region 807b via a dielectric layer, and a second gate 802b may be coupled to the second N− base region 808b via a dielectric layer. Isolate gates 803b, 805b may be coupled to the third and fourth N− base region 811b, 835b via a dielectric layer. The isolate gates 803b, 805b may be used to isolate N++ base contact from P++ collector. A current gain of the PNP dual mode transistor 800b may be controlled by a gate voltage applied to the gates 801b, 802b. The PNP dual mode transistor 800b may also include a P− substrate 810b.

The PNP dual mode transistor 800b may operate in a digital MOS mode (e.g., a unipolar operation mode) and an analog gate control BJT mode (e.g., bipolar operation mode). For example, the gate voltages may be biased so that a gate-source-voltage enables formation of an inversion layer within the first and second N− base region 807b, 808b. A unipolar current (e.g., holes) may flow between the collector regions 804b, 832b and the emitter region 806b. The N++ base contact 812b, 836b may be biased such that an absolute value of a voltage difference between the N− base well 809b and the first collector region 804b, second collector region 832b is greater than a forward junction voltage ($V_j$) of the PNP dual mode transistor 800b. In a particular embodiment, the N++ base contact may be biased to a voltage that is less than a negative forward junction voltage (e.g., −0.7 V) of the PNP dual mode transistor 800b. Biasing the N++ base contact may enable the PNP dual mode transistor 800b to operate according to a PNP BJT (e.g., generate a bipolar current including holes and electrons).

Figure 9A:
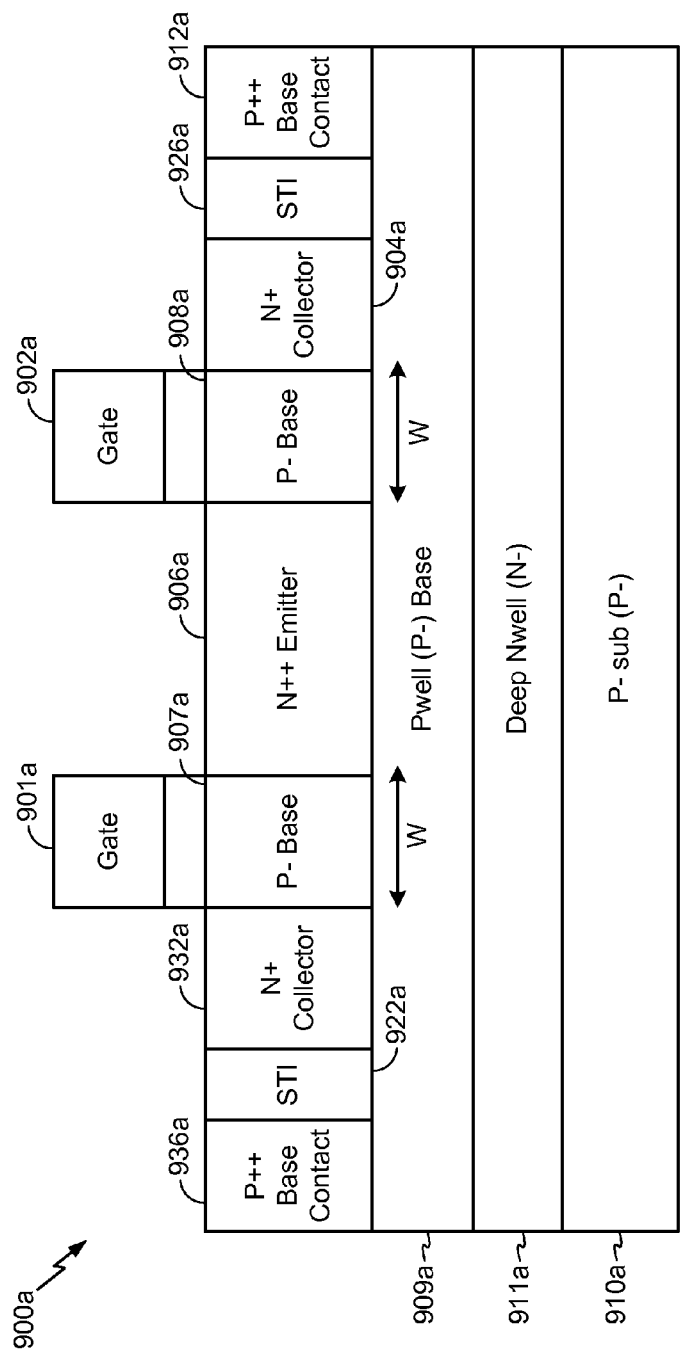
FIGS. 9a and 9b are diagrams of particular illustrative embodiments of an NPN dual mode transistor.

Referring to FIG. 9a, a particular illustrative embodiment of an NPN dual mode transistor 900a is shown. In a particular embodiment, the NPN dual mode transistor 900a may correspond to the dual mode transistor 100 of FIG. 1.

The NPN dual mode transistor 900a includes a first p− base region 907a and a second P− base region 908a. Each P− base region 907a, 908a may have a particular width (W). The first P− base region 907a and the second P− base region 908a may be coupled to (or include) a P− base well 909a. A P++ base contact 912a, 936a may also be coupled to the P− base regions 907a, 908a via the P− base well 909a. In a particular embodiment, the P++ base contact 912a, 936a may correspond to the first terminal 112 of FIG. 1. The NPN dual mode transistor 900a also includes an emitter region 906a, a first collector region 904a, and a second collector region 932a. The emitter region 906a, the first collector region 904a, and the second collector region 932a may each be doped with an N++ concentration. A first STI area 922a may prevent (or reduce) current leakage (from P++ base contact 936a). A second STI area 926a may prevent (or reduce) current leakage between the first collector region 904a and the P++ base contact 912a.

A first gate 901a may be coupled to the first P– base region 907a via a dielectric layer, and a second gate 902a may be coupled to the second P– base region 907a via a dielectric layer. A current gain of the NPN dual mode transistor 900a may be controlled by a gate voltage applied to the gates 901a, 902a. The NPN dual mode transistor 900a may also include a P– base well 910a and an N– base well 911a.

The NPN dual mode transistor 900a may operate in a digital MOS mode (e.g., a unipolar operation mode) and an analog gate control BJT mode (e.g., bipolar operation mode). For example, the gate voltages may be biased so that a gate-source-voltage enables formation of an inversion layer within the first and second N– base regions 907a and 908a. A unipolar current (e.g., electrons) may between the first and second collector region 932a, 904a and the emitter region 906a. The P++ base contact 912a and 936a may be biased such that an absolute value of a voltage difference between the P– base well 909a and the first and second collector regions 932a, 904a is greater than the junction voltage ($V_j$) of the NPN dual mode transistor 900a. Biasing the P++ base contact may enable the NPN dual mode transistor 900a to operate according to a NPN BJT (e.g., generate a bipolar current including holes and electrons).

Figure 9B:
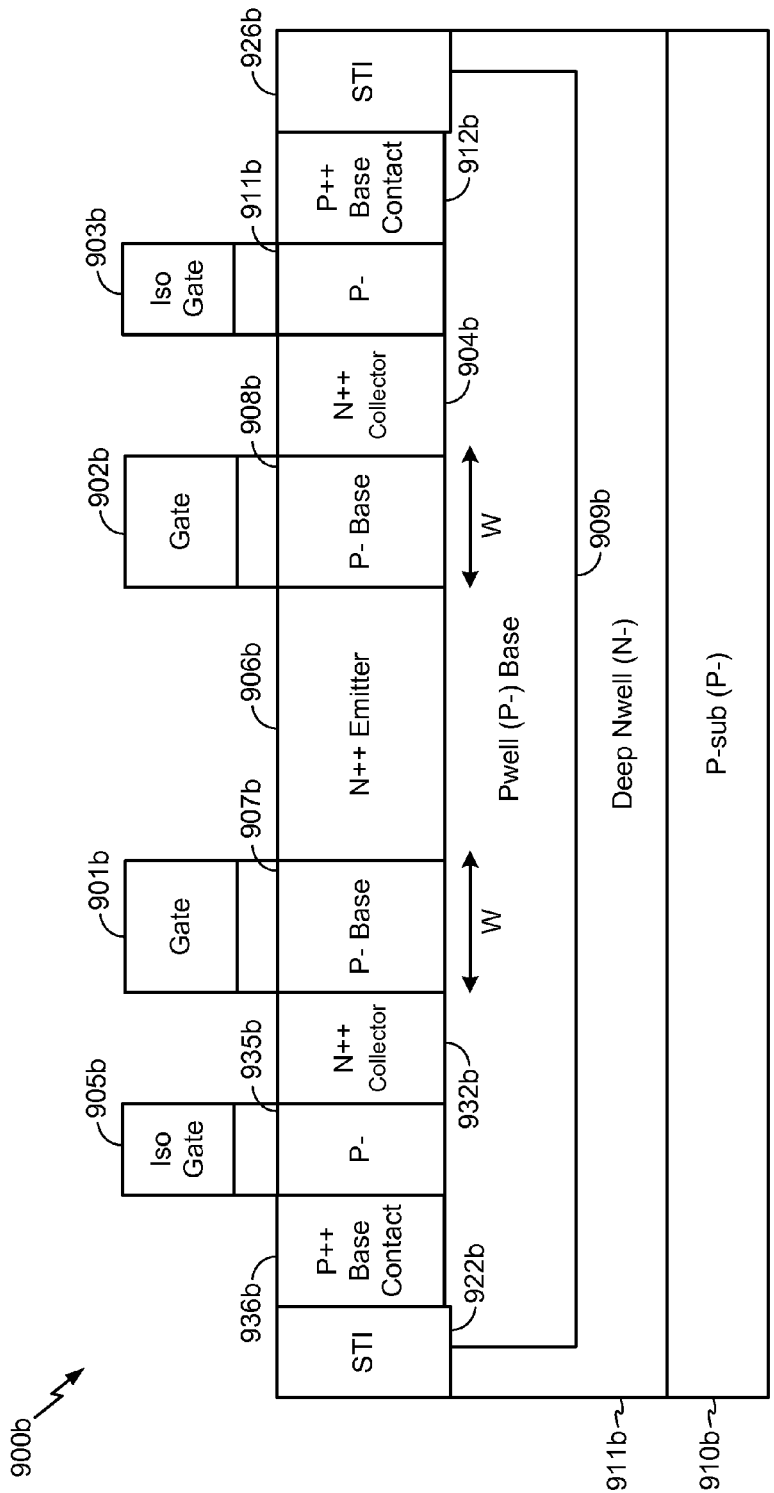

Referring to FIG. 9b, a particular illustrative embodiment of an NPN dual mode transistor 900b is shown. In a particular embodiment, the NPN dual mode transistor 900b may correspond to the dual mode transistor 100 of FIG. 1.

The NPN dual mode transistor 900b includes a first p– base region 907b and a second P– base region 908b. Each P– base region 907b, 908b may have a particular width (W). The first P– base region 907b and the second P– base region 908b may be coupled to (or include) a P– base well 909b. A P++ base contact 912b and 936b may also be coupled to the P– base regions 907b, 908b via the P– base well 909b. In a particular embodiment, the P++ base contact 912b and 936b may correspond to the first terminal 112 of FIG. 1. The NPN dual mode transistor 900b also includes an emitter region 906b, a first collector region 904b, and a second collector region 932b. The emitter region 906b, the first collector region 904b, and the second collector region 932b may each be doped with an N++ concentration. A first STI area 922b may prevent (or reduce) current leakage (from P++ base contact 936b). A second STI area 926b may prevent (or reduce) current leakage between the first collector region 904b and the P++ base contact 912b.

A first gate 901b may be coupled to the first P– base region 907b via a dielectric layer, and a second gate 902b may be coupled to the second P– base region 907b via a dielectric layer. Isolate gates 903b, 905b may be coupled to the third and fourth N– base region 911b, 935b via a dielectric layer. The isolate gates 903b, 905b used to isolate N++ base contact from P++ collector. A current gain of the NPN dual mode transistor 900b may be controlled by a gate voltage applied to the gates 901b, 902b. The NPN dual mode transistor 900b may also include a P– base well 910b and an N– base well 911b.

The NPN dual mode transistor 900b may operate in a digital MOS mode (e.g., a unipolar operation mode) and an analog gate control BJT mode (e.g., bipolar operation mode). For example, the gate voltages may be biased so that a gate-source-voltage enables formation of an inversion layer within the first and second N– base regions 907b and 908b. A unipolar current (e.g., electrons) may between the first and second collector region 932b, 904b and the emitter region 906b. The P++ base contact 912b and 936b may be biased such that an absolute value of a voltage difference between the P– base well 909b and the first and second collector region 932b and 904b is greater than the junction voltage ($V_j$) of the NPN dual mode transistor 900b. Biasing the P++ base contact may enable the NPN dual mode transistor 900b to operate according to a NPN BJT (e.g., generate a bipolar current including holes and electrons).

Figure 10A:
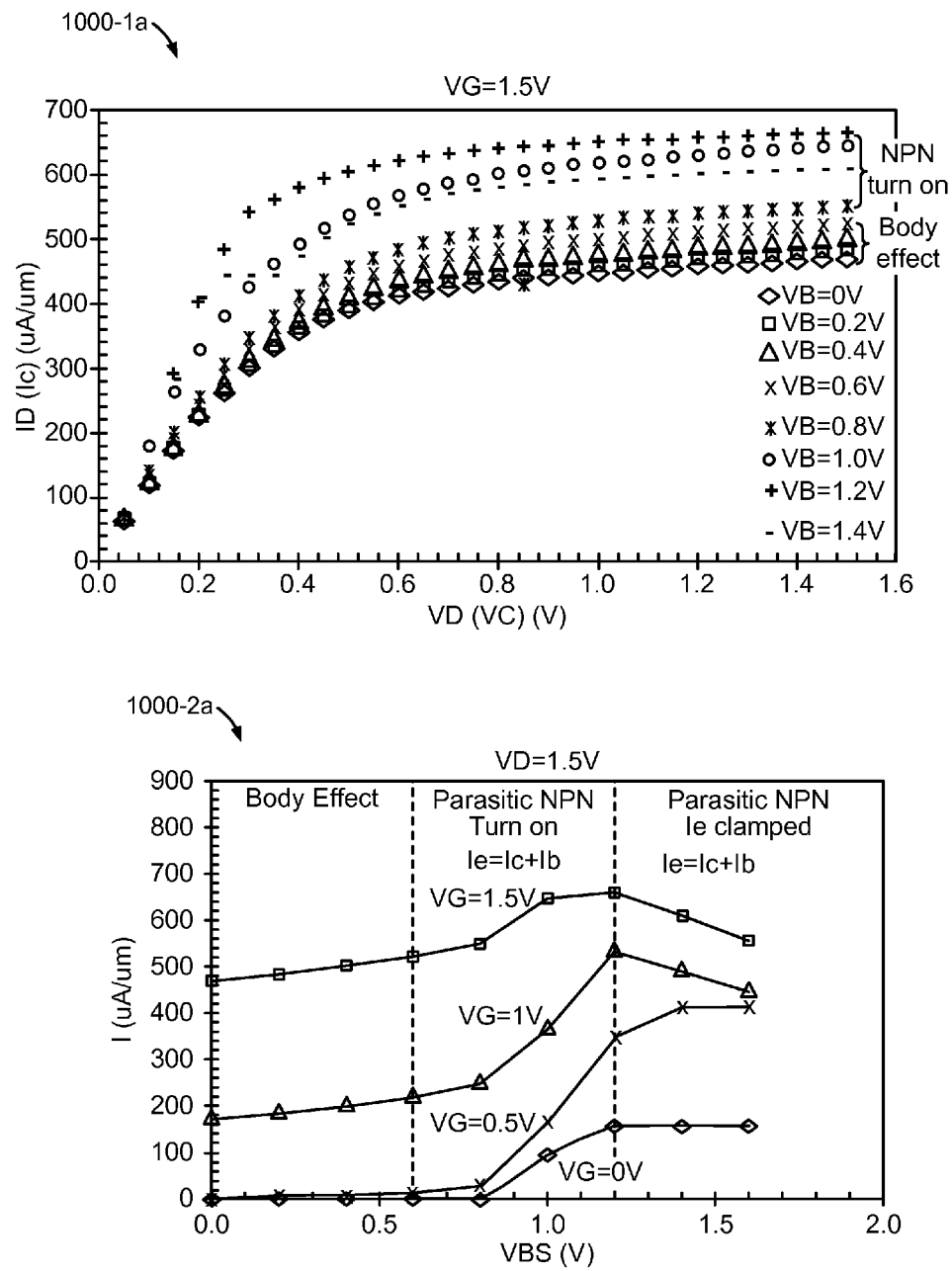
FIGS. 10a and 10b are particular illustrative charts depicting drain current, a current gain, and a transconductance of a dual mode transistor based on biasing characteristics.

Referring to FIG. 10a, a particular illustrative chart 1000-1a depicting a change in drain current of a dual mode transistor based on biasing characteristics is shown. Values and results depicted in the chart 1000-1a are provided for illustrative purposes and should not be construed as limiting. Values may vary based on external conditions (e.g., temperature), gate widths of the dual mode transistor, gate lengths of the dual mode transistors, doping concentrations associated with the dual mode transistor, biasing voltages, etc.

The chart 1000-1a illustrates operating results that correspond to an NPN-type configuration of the dual mode transistor 100 of FIG. 1. For example, the second voltage ($V_2$) applied to the first terminal 112 may correspond to the base voltage ($V_B$) depicted in the chart 1000. In addition, the first voltage ($V_1$) applied to the first gate region 102 of FIG. 1 may be approximately 1.5 V, as depicted in the chart 1000-1a.

The chart 1000-1a illustrates that a drain current (e.g., a collector current) may increase as the base voltage ($V_B$) increases for a particular drain voltage. As an illustrative example, the drain current may be approximately 540 uA/um when a 0.8 V signal is applied to the first terminal 112 and a 1.5 V signal is applied to the drain. However, when a 0.8 V signal is applied to the base and a 0.2 V signal is applied to the second terminal the drain current may be reduced to approximately 240 uA/um.

Thus, the drain current increases when both the unipolar operation (e.g., the FET operation) associated with unipolar current and the bipolar operation (e.g., the BJT operation) associated with the bipolar current are active as opposed to when only a single operation (e.g., unipolar or bipolar) is active. For example, when the base voltage ($V_B$) is 0.2 V (e.g., when the bipolar operation is inactive and the unipolar operation is active) the drain current is approximately 450 uA/um when a 1.5 voltage signal is applied to the drain. However, when the base voltage ($V_B$) is 1.2 V (e.g., when the bipolar operation and the unipolar operation are active), the drain current increases to approximately 650 uA/um when the 1.5 voltage signal is applied to the drain.

Another particular illustrative chart 1000-2a depicts the first gate region 102 controlling drain current at different the first terminal 112 (base) voltage of FIG. 1. The base voltage between 0.6V~1.2V has higher NPN efficiency.

Figure 10B:
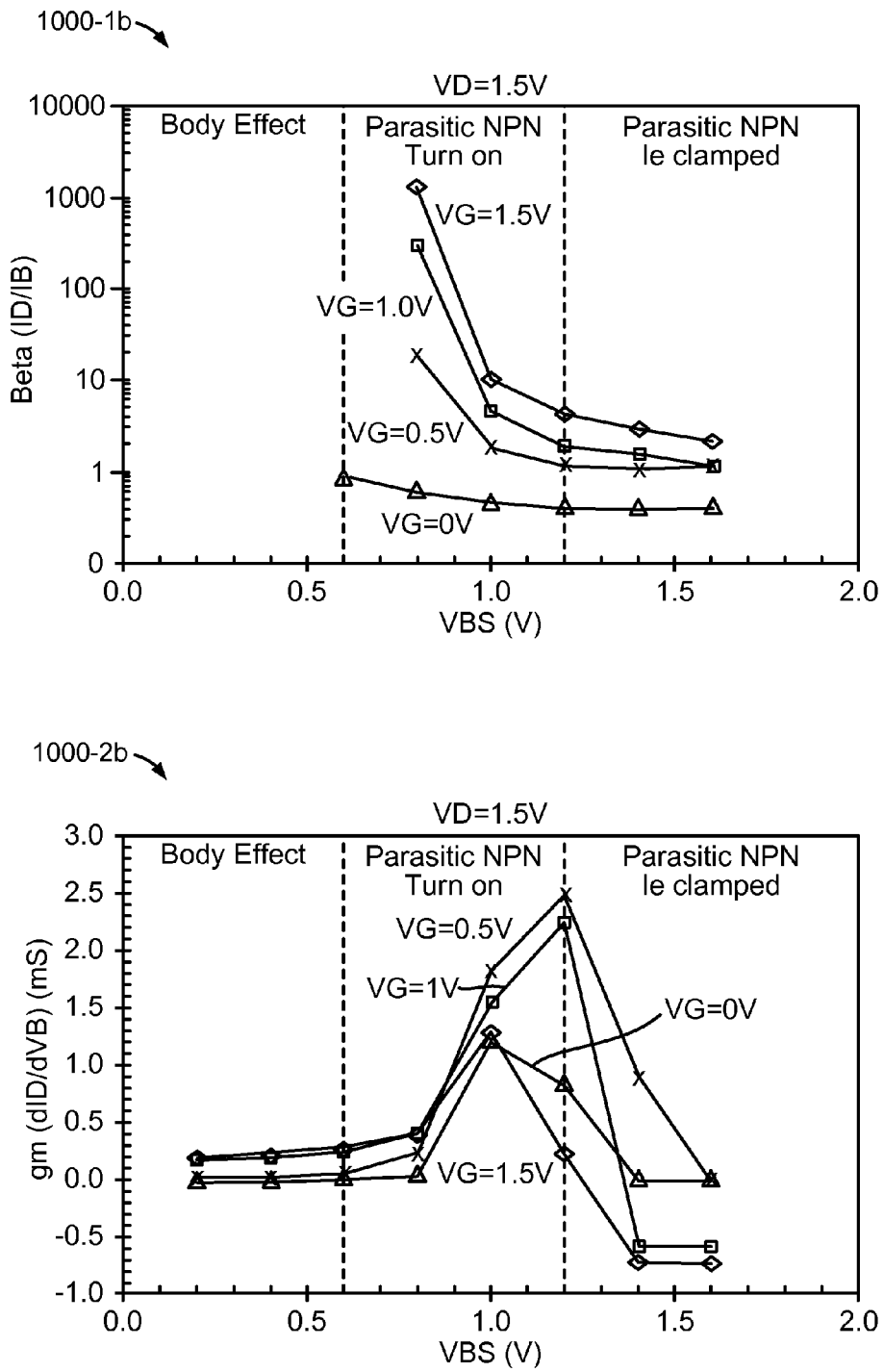

Referring to FIG. 10b, a particular illustrative chart 1000-1b depicting a change in current gain (beta) of a dual mode transistor based on biasing characteristics of the first gate region 102 and the first terminal 112 voltage of FIG. 1 is shown. In an NPN activated region (e.g., where the first terminal voltage of FIG. 1 is 0.6V~1.2V), the current gain (beta) of the NPN is controlled by the first gate region voltage 102 and the first terminal region 112 voltage of FIG. 1.

Another particular illustrative chart 1000-2b depicting a change in transconductance (gm) of a dual mode transistor based on biasing characteristics of the first gate region 102 and the first terminal 112 voltage of FIG. 1 is shown. In an NPN activated region (e.g., where the first terminal voltage of FIG. 1 is 0.6V~1.2V), the transconductance (gm) of the NPN is controlled by the first gate region voltage 102 and the first terminal region 112 voltage of FIG. 1.

Figure 11:
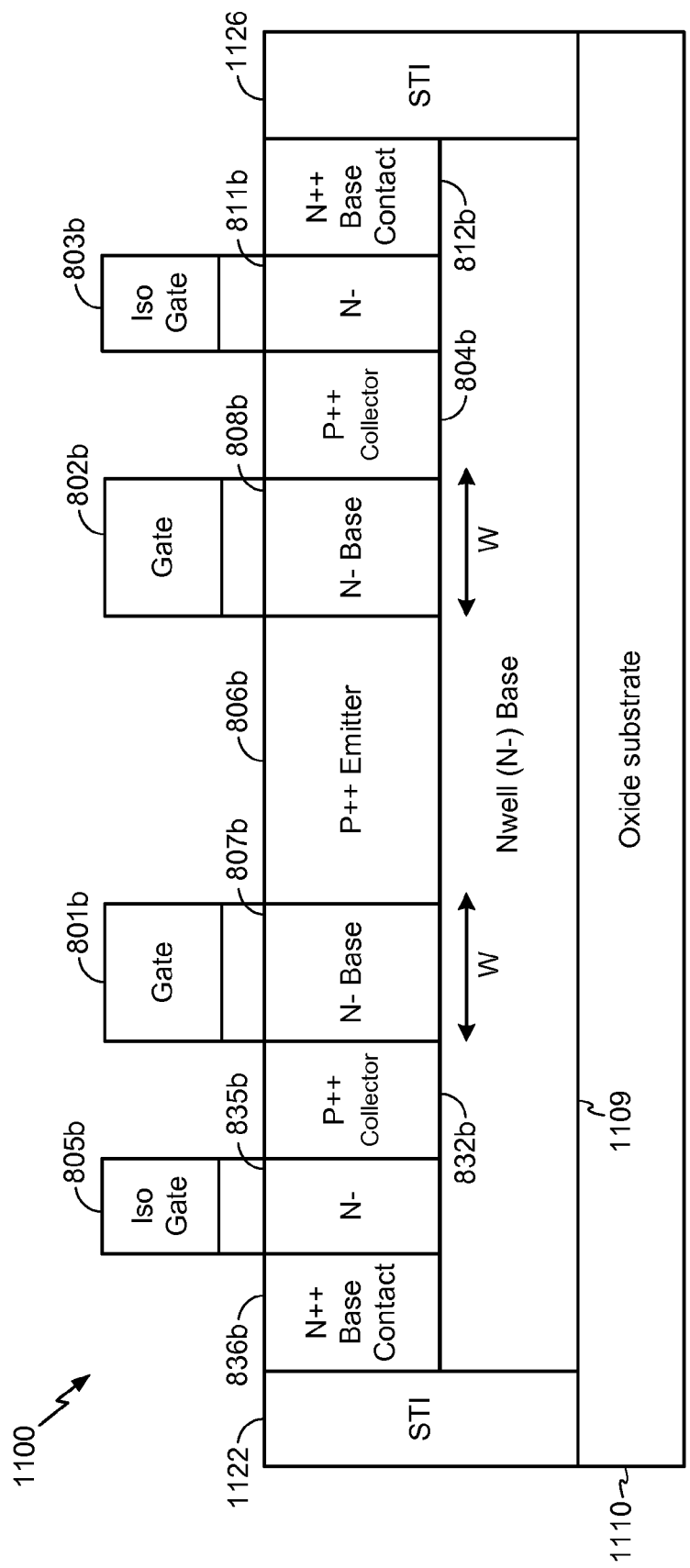
FIG. 11 is a diagram of a particular illustrative embodiment of a silicon-on-insulator (SOI) PNP dual mode transistor.

Referring to FIG. 11, a particular illustrative embodiment of a silicon-on-insulator (SOI) PNP dual mode transistor 1100 is shown. In a particular embodiment, the SOI PNP dual mode transistor 1100 may correspond to the dual mode transistor 100 of FIG. 1. The SOI PNP dual mode transistor 1100 may include a similar configuration as the PNP dual mode transistor 800b of FIG. 8b; however, STIs 1122, 1126 may be extended through an Nwell base 1109 and may be coupled with an oxide substrate 1110. The oxide substrate 1110 may be different from the P− substrate 810b of FIG. 8b. For example, the SOI PNP dual mode transistor 1100 may have a PMOS/PNP silicon-on-insulator configuration and the PNP dual mode transistor 800b of FIG. 8b may have a PMOS/PNP bulk silicon configuration.

Figure 12:
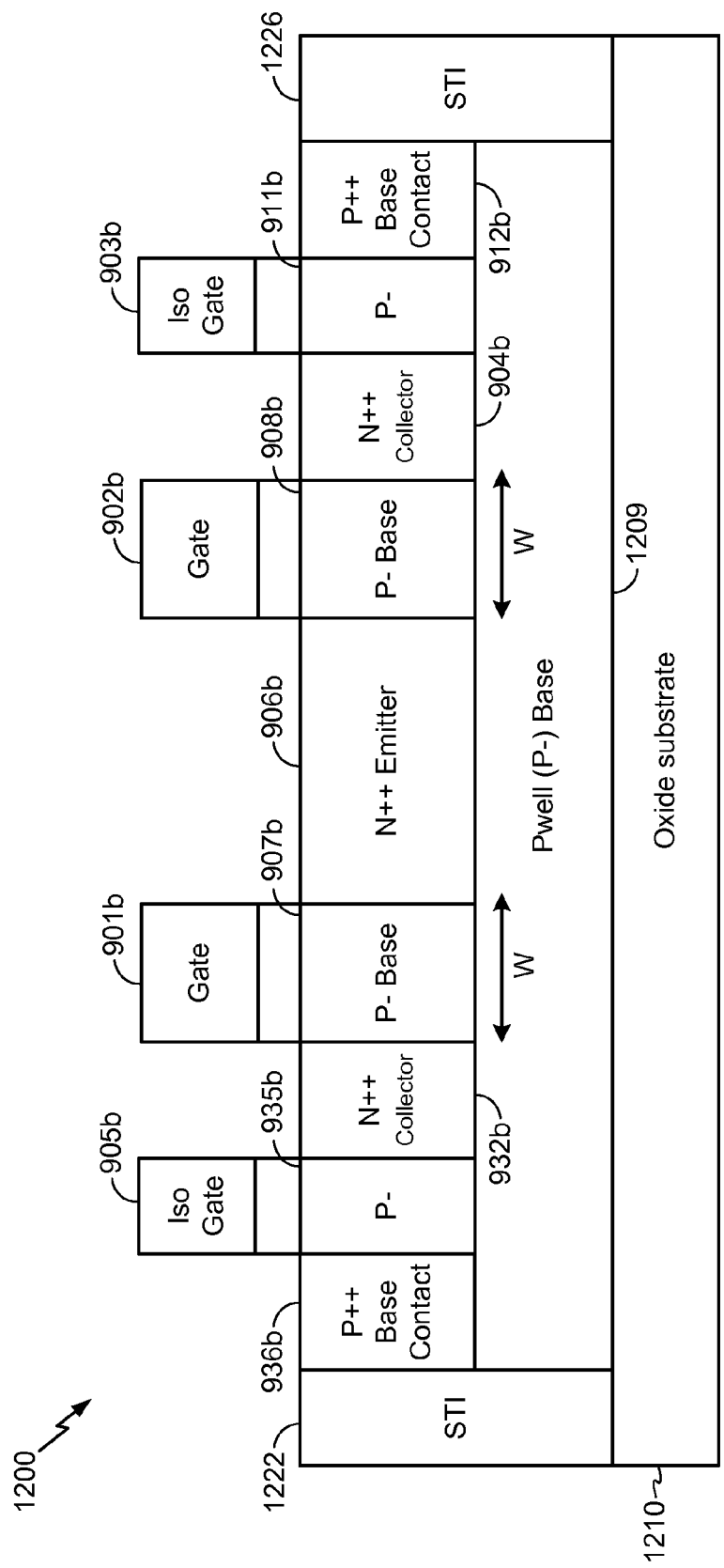
FIG. 12 is a diagram of a particular illustrative embodiment of a SOI NPN dual mode transistor.

Referring to FIG. 12, a particular illustrative embodiment of a silicon-on-insulator (SOI) NPN dual mode transistor 1200 is shown. In a particular embodiment, the SOI NPN dual mode transistor 1200 may correspond to the dual mode transistor 100 of FIG. 1. The SOI NPN dual mode transistor 1200 may include a similar configuration as the NPN dual mode transistor 900b of FIG. 9b; however, STIs 1222, 1226 may be extended through a Pwell base 1209 and may be coupled with an oxide substrate 1210. The oxide substrate 1210 may be different from the P− base well 910b and the N− base well 911b. For example, the SOI NPN dual mode transistor 1200 may have a NMOS/NPN silicon-on-insulator configuration and the NPN dual mode transistor 900b of FIG. 9b may have a NMOS/NPN bulk silicon configuration.

Figure 13:
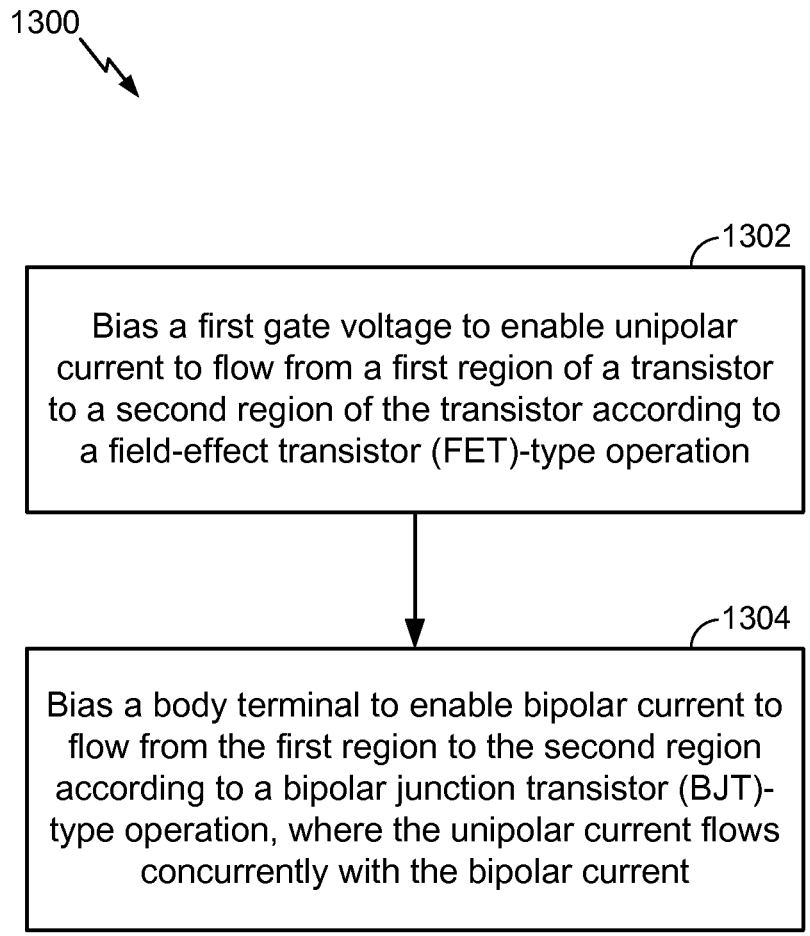
FIG. 13 is a flowchart of a particular embodiment of a method of biasing a dual mode transistor.

Referring to FIG. 13 a flowchart of a particular embodiment of a method 1300 of biasing a dual mode transistor is shown. In an illustrative embodiment, the method 1300 may be performed with respect to the dual mode transistor 100 of FIG. 1, at least one of the embodiments 310-340 of the FET-type configurations of FIG. 3, at least one of the embodiments 410-440 of the BJT-type configurations of FIG. 4, at least one of the embodiments 510, 520 of the inverter mixer of FIG. 5, the differential mixer 600 of FIG. 6, at least one of the embodiments 710, 720 of the inverter driver of FIG. 7, the PNP dual mode transistors 800a, 800b of FIGS. 8a and 8b, the NPN dual mode transistors 900a, 900b of FIGS. 9a and 9b, the SOI PNP dual mode transistor 1100 of FIG. 11, the SOI NPN dual mode transistor 1200 of FIG. 12, or any combination thereof.

The method 1100 includes biasing a first gate voltage to enable unipolar current to flow from a first region of a transistor to a second region of the transistor according to a FET-type operation, at 1302. For example, in FIG. 1, the first gate voltage of the first gate region 102 may be biased to a first voltage ($V_1$). Biasing the first gate voltage may enable unipolar current to flow from the first region 104 to the second region 106 according to a FET-type operation. For example, the source voltage ($V_s$) may be applied to the first region 104. In a PNP configuration, the first gate region 102 may be biased such that the first voltage ($V_1$) is lower than the source voltage ($V_s$). For example, the supply voltage ($V_{dd}$) may be applied to the first region 104 (e.g., the source), and the first voltage ($V_1$) may range from ground (e.g., zero volts) to the supply voltage ($V_{dd}$) such that the gate voltage is lower than the source voltage ($V_s$). Biasing the first gate region 102 with the first voltage ($V_1$) may enable channel formation (e.g., formation of an inversion layer) within the first body region 108 between the first region 104 and the second region 106. The unipolar current (e.g., holes) according to a PFET operation may flow from the first region 104 to the second region 106.

In an NPN configuration, the first gate region 102 may be biased such that the first voltage ($V_1$) is greater than a source voltage. For example, a ground voltage (e.g., zero volts) may be applied to the second region 106 (e.g., the source), and the first voltage ($V_1$) may range from ground to the supply voltage ($V_{dd}$) such that the first voltage ($V_1$) is greater than the source voltage. Biasing the first gate region 102 with the first voltage ($V_1$) may enable channel formation (e.g., formation of an inversion layer) within the first body region 108 between the first region 104 and the second region 106. The unipolar current (e.g., electrons) according to an NFET operation may flow from the first region 104 to the second region 106.

A body terminal may be biased to enable bipolar current to flow from the first region to the second region according to a BJT-type operation, at 1304. For example, in FIG. 1, the first terminal 112 (coupled to the first body region 108) may be biased to the second voltage ($V_2$). The first terminal 112 may be biased such that an absolute value of a body-to-source voltage (e.g., a voltage difference between the second voltage ($V_2$) and the source voltage ($V_s$)) is greater than a junction voltage ($V_j$) of the dual mode transistor 100. Biasing the first terminal 112 may enable bipolar current to flow between the first region 104 and the second region 106 concurrently with the unipolar current. In the PNP configuration, the second voltage ($V_2$) applied to the first terminal 112 (coupled to the first body region 108) may be biased to a voltage that is less than a negative forward junction voltage (e.g., −0.7 V) of the dual mode transistor 100. In the NPN configuration, the second voltage ($V_2$) applied to the first terminal 112 (coupled to the first body region 108) may be biased to a voltage that is greater than a forward junction voltage (e.g., 0.7 V) of the dual mode transistor 100. Thus, a bipolar current (including electrons and holes) according to a BJT-type operation may flow between the first region 104 and the second region 106 in response to biasing the first terminal 112 to the second voltage ($V_2$).

The method 1300 of FIG. 13 may enable a concurrent digital MOS operation mode (e.g., a unipolar operation mode corresponding to a unipolar current) and an analog gate control BJT operation mode (e.g., bipolar operation mode corresponding to a bipolar current). Thus, increased current, based on the unipolar and bipolar operation currents, may flow through the dual mode transistor 100 without increasing a supply voltage ($V_{dd}$) applied to the dual mode transistor 100. Increasing the current without increasing the supply voltage ($V_{dd}$) may yield increased operation efficiency. The dual mode transistor enables the gate control BJT operation and provides high performance BJT transistor in logic CMOS process.

Figure 14:
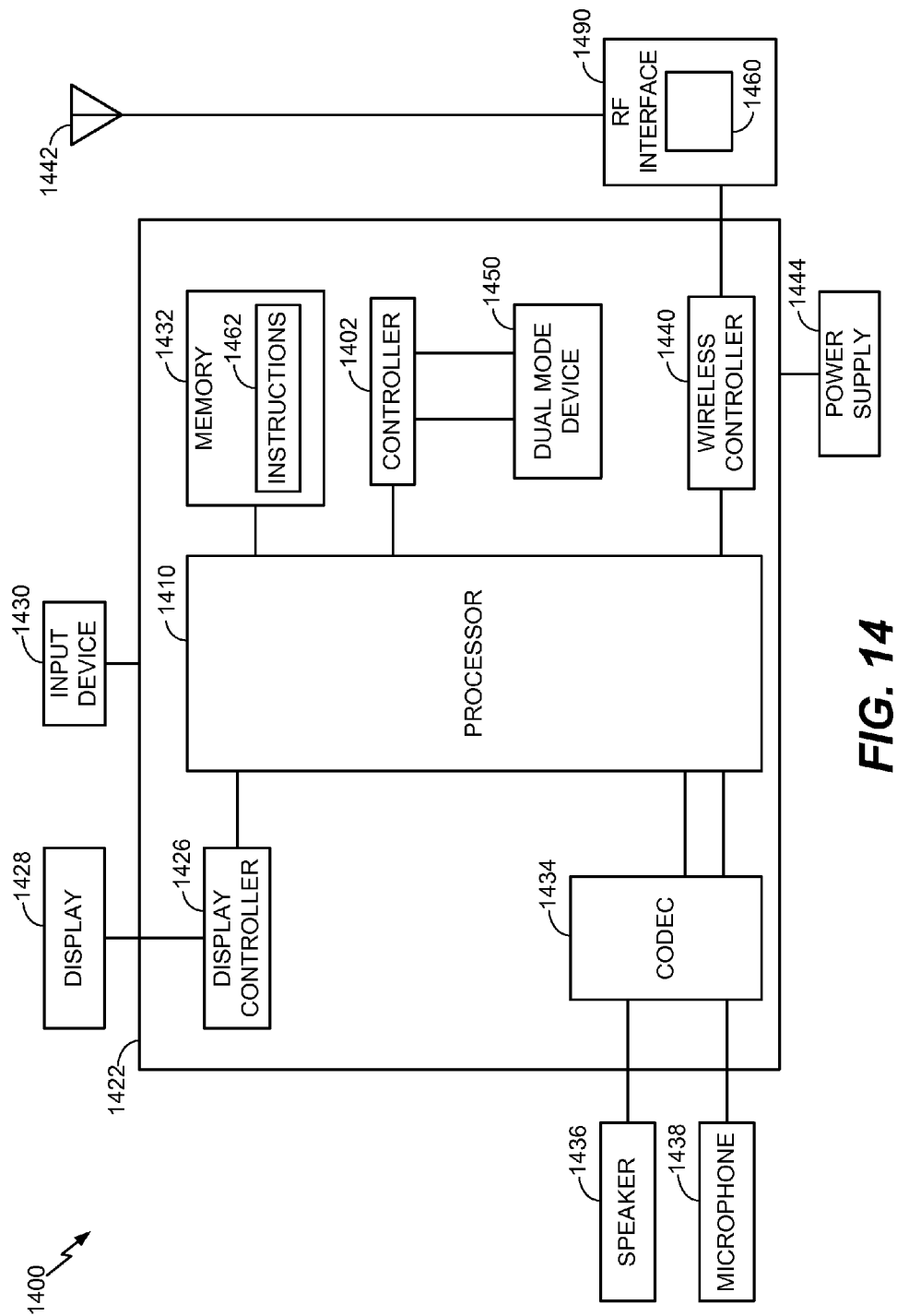
FIG. 14 is a block diagram of a wireless device including a dual mode transistor and a component operable to bias the dual mode transistor.
Figure 15:
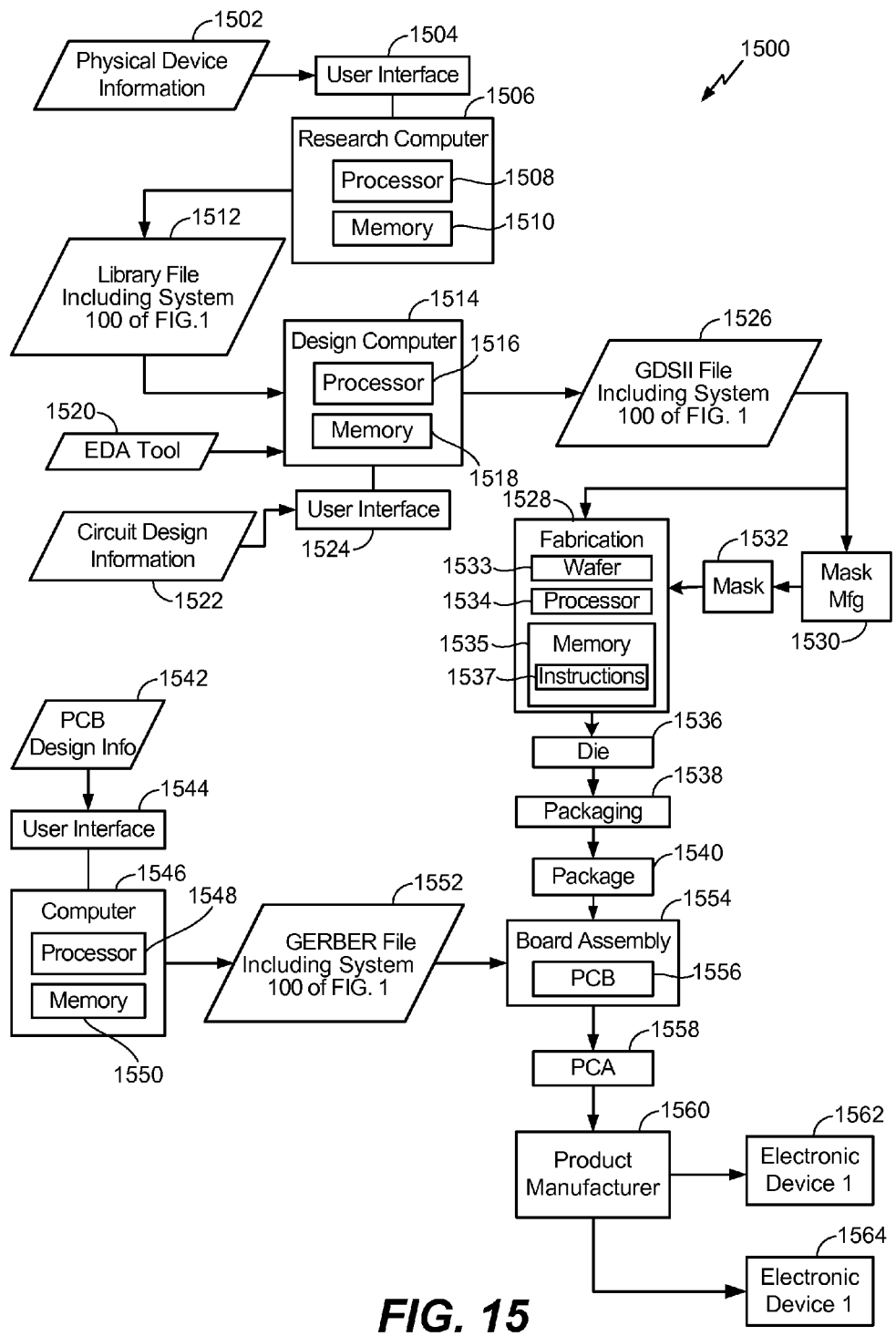
FIG. 15 is a data flow diagram of a particular illustrative embodiment of a manufacturing process to manufacture electronic devices that include a dual mode transistor and a component operable to bias the dual mode transistor.

Referring to FIG. 14, a block diagram of a wireless device 1400 including a component that is operable to bias a dual mode transistor is shown. The device 1400 includes a processor 1410, such as a digital signal processor (DSP), coupled to a memory 1432.

FIG. 14 also shows a display controller 1426 that is coupled to the processor 1410 and to a display 1428. A coder/decoder (CODEC) 1434 can also be coupled to the processor 1410. A speaker 1436 and a microphone 1438 can be coupled to the CODEC 1434. FIG. 14 also indicates that a wireless controller 1440 can be coupled to the processor 1410 and to an antenna 1442 via a radio-frequency (RF) interface 1490 disposed between the wireless controller 1440 and the antenna 1442. The RF interface 1490 may include a dual mode transistor device 1460 (or a component that includes one or more dual mode transistor devices). The dual mode transistor device 1460 may include, or correspond to, the dual mode transistor 100 of FIG. 1, at least one of the embodiments 310-340 of the FET-type configurations of FIG. 3, at least one of the embodiments 410-440 of the BJT-type configurations of FIG. 4, at least one of the embodiments 510, 520 of the inverter mixer of FIG. 5, the differential mixer 600 of FIG. 6, at least one of the embodiments 710, 720 of the inverter driver of FIG. 7, the PNP dual mode transistors 800*a*, 800*b* of FIGS. 8*a* and 8*b*, the NPN dual mode transistors 900*a*, 900*b* of FIGS. 9*a* and 9*b*, the SOI PNP dual mode transistor 1100 of FIG. 11, the SOI NPN dual mode transistor 1200 of FIG. 12, or any combination thereof.

A controller 1402 may also be coupled to the processor 1410 and to a dual mode transistor device 1450 (or a component that includes one or more dual mode transistor devices). The dual mode transistor device 1450 may include, or correspond to, the dual mode transistor 100 of FIG. 1, at least one of the embodiments 310-340 of the FET-type configurations of FIG. 3, at least one of the embodiments 410-440 of the BJT-type configurations of FIG. 4, at least one of the embodiments 510, 520 of the inverter mixer of FIG. 5, the differential mixer 600 of FIG. 6, at least one of the embodiments 710, 720 of the inverter driver of FIG. 7, the PNP dual mode transistor 800*a*, 800*b* of FIGS. 8*a* and 8*b*, the NPN dual mode transistor 900*a*, 900*b* of FIGS. 9*a* and 9*b*, the SOI PNP dual mode transistor 1100 of FIG. 11, the SOI NPN dual mode transistor 1200 of FIG. 12, or any combination thereof. In a particular embodiment, the controller 1402 may be a hardware controller, a firmware, or a combination thereof.

The memory 1432 may be a tangible non-transitory processor-readable storage medium that includes executable instructions 1456. The instructions 1456 may be executed by a processor, such as the controller 1402, to perform the method 1300 of FIG. 13. For example, the instructions 1456 may be executable by the controller 1402 to bias the gate of the dual mode transistor device 1450 and/or the dual mode transistor device 1460. The instructions 1456 may also be executable by the controller 1402 to bias the terminal coupled to a body region of the dual mode transistor device 1450 and/or the dual mode transistor device 1460. The instructions 1456 may also be executable by an alternative processor (not shown) coupled to the processor 1410.

In a particular embodiment, the processor 1410, the display controller 1426, the memory 1432, the CODEC 1434, and the wireless controller 1440 are included in a system-in-package or system-on-chip device 1422. In a particular embodiment, an input device 1430 and a power supply 1444 are coupled to the system-on-chip device 1422. Moreover, in a particular embodiment, as illustrated in FIG. 14, the display 1428, the input device 1430, the speaker 1436, the microphone 1438, the antenna 1442, and the power supply 1444 are external to the system-on-chip device 1422. However, each of the display 1428, the input device 1430, the speaker 1436, the microphone 1438, the antenna 1442, and the power supply 1444 can be coupled to a component of the system-on-chip device 1422, such as an interface or a controller.

In conjunction with the described embodiments, an apparatus includes means for biasing a first gate voltage to enable unipolar current to flow from a first region of a transistor to a second region of the transistor according to a FET-type operation. For example, the means for biasing the first gate voltage may include the controller 1402 operable to execute the instructions 1462 of FIG. 14, one or more other devices, circuits, modules, or any combination thereof.

The apparatus may also include means for biasing a body terminal to enable bipolar current to flow from the first region to the second region according to a BJT-type operation. The unipolar current may flow concurrently with the bipolar current. For example, the means for biasing the body terminal may include the controller 1402 operable to execute the instructions 1462 of FIG. 14, one or more other devices, circuits, modules, or any combination thereof.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 13 depicts a particular illustrative embodiment of an electronic device manufacturing process 1300.

Physical device information 1302 is received at the manufacturing process 1300, such as at a research computer 1306. The physical device information 1302 may include design information representing at least one physical property of a semiconductor device, such as a device that includes the dual mode transistor 100 of FIG. 1, at least one of the embodiments 310-340 of the FET-type configurations of FIG. 3, at least one of the embodiments 410-440 of the BJT-type configurations of FIG. 4, at least one of the embodiments 510, 520 of the inverter mixer of FIG. 5, the differential mixer 600 of FIG. 6, at least one of the embodiments 710, 720 of the inverter driver of FIG. 7, the PNP dual mode transistor 800*a*, 800*b* of FIGS. 8*a* and 8*b*, the NPN dual mode transistor 900*a*, 900*b* of FIGS. 9*a* and 9*b*, the SOI PNP dual mode transistor 1100 of FIG. 11, the SOI NPN dual mode transistor 1200 of FIG. 12, the dual mode transistor device 1450 of FIG. 14, the dual mode transistor device 1460 of FIG. 14, or any combination thereof. For example, the physical device information 1502 may include physical parameters, material characteristics, and structure information that is entered via a user interface 1504 coupled to the research computer 1506. The research computer 1506 includes a processor 1508, such as one or more processing cores, coupled to a computer readable medium such as a memory 1510. The memory 1510 may store computer readable instructions that are executable to cause the processor 1508 to transform the physical device information 1502 to comply with a file format and to generate a library file 1512.

In a particular embodiment, the library file 1512 includes at least one data file including the transformed design information. For example, the library file 1512 may include a library of semiconductor devices including the dual mode transistor 100 of FIG. 1, at least one of the embodiments 310-340 of the FET-type configurations of FIG. 3, at least one of the embodiments 410-440 of the BJT-type configurations of FIG. 4, at least one of the embodiments 510, 520 of the inverter mixer of FIG. 5, the differential mixer 600 of FIG. 6, at least one of the embodiments 710, 720 of the inverter driver of FIG. 7, the PNP dual mode transistor 800*a*, 800*b* of FIGS. 8*a* and 8*b*, the NPN dual mode transistor 900*a*, 900*b* of FIGS. 9*a* and 9*b*, the SOI PNP dual mode transistor 1100 of FIG. 11, the SOI NPN dual mode transistor 1200 of FIG. 12, the dual mode transistor device 1450 of FIG. 14, the dual mode transistor device 1460 of FIG. 14, or any combination thereof, that is provided for use with an electronic design automation (EDA) tool 1520.

The library file 1512 may be used in conjunction with the EDA tool 1520 at a design computer 1514 including a processor 1516, such as one or more processing cores, coupled to a memory 1518. The EDA tool 1520 may be stored as processor executable instructions at the memory 1518 to enable a user of the design computer 1514 to design a device that includes the dual mode transistor 100 of FIG. 1, at least one of the embodiments 310-340 of the FET-type configurations of FIG. 3, at least one of the embodiments 410-440 of the BJT-type configurations of FIG. 4, at least one of the embodiments 510, 520 of the inverter mixer of FIG. 5, the differential mixer 600 of FIG. 6, at least one of the embodiments 710, 720 of the inverter driver of FIG. 7, the PNP dual mode transistor 800 of FIG. 8, the NPN dual mode transistor 900 of FIG. 9, the dual mode transistor device 1250 of FIG. 12, the dual mode transistor device 1260 of FIG. 12, or any combination thereof. To illustrate, the circuit design property may include identification of particular circuits and relationships to other elements in a circuit design, positioning information, feature size information, interconnection information, or other information representing a physical property of a semiconductor device.

The design computer 1514 may be configured to transform the design information, including the circuit design information 1522, to comply with a file format. To illustrate, the file formation may include a database binary file format representing planar geometric shapes, text labels, and other information about a circuit layout in a hierarchical format, such as a Graphic Data System (GDSII) file format. The design computer 1514 may be configured to generate a data file including the transformed design information, such as a GDSII file 1526 that includes information describing a device that includes the dual mode transistor 100 of FIG. 1, at least one of the embodiments 310-340 of the FET-type configurations of FIG. 3, at least one of the embodiments 410-440 of the BJT-type configurations of FIG. 4, at least one of the embodiments 510, 520 of the inverter mixer of FIG. 5, the differential mixer 600 of FIG. 6, at least one of the embodiments 710, 720 of the inverter driver of FIG. 7, the PNP dual mode transistor 800a, 800b of FIGS. 8a and 8b, the NPN dual mode transistor 900a, 900b of FIGS. 9a and 9b, the SOI PNP dual mode transistor 1100 of FIG. 11, the SOI NPN dual mode transistor 1200 of FIG. 12, the dual mode transistor device 1450 of FIG. 14, the dual mode transistor device 1460 of FIG. 14, or any combination thereof, and that also includes additional electronic circuits and components within the SOC.

The GDSII file 1526 may be received at a fabrication process 1528 to manufacture a semiconductor device that includes the dual mode transistor 100 of FIG. 1, at least one of the embodiments 310-340 of the FET-type configurations of FIG. 3, at least one of the embodiments 410-440 of the BJT-type configurations of FIG. 4, at least one of the embodiments 510, 520 of the inverter mixer of FIG. 5, the differential mixer 600 of FIG. 6, at least one of the embodiments 710, 720 of the inverter driver of FIG. 7, the PNP dual mode transistor 800 of FIG. 8, the NPN dual mode transistor 900 of FIG. 9, the dual mode transistor device 1250 of FIG. 12, the dual mode transistor device 1260 of FIG. 12, or any combination thereof, according to transformed information in the GDSII file 1526. For example, a device manufacture process may include providing the GDSII file 1526 to a mask manufacturer 1530 to create one or more masks, such as masks to be used with photolithography processing, illustrated as a representative mask 1532. The mask 1532 may be used during the fabrication process to generate one or more wafers 1534, which may be tested and separated into dies, such as a representative die 1536. The die 1536 includes a circuit including the dual mode transistor 100 of FIG. 1, at least one of the embodiments 310-340 of the FET-type configurations of FIG. 3, at least one of the embodiments 410-440 of the BJT-type configurations of FIG. 4, at least one of the embodiments 510, 520 of the inverter mixer of FIG. 5, the differential mixer 600 of FIG. 6, at least one of the embodiments 710, 720 of the inverter driver of FIG. 7, the PNP dual mode transistor 800a, 800b of FIGS. 8a and 8b, the NPN dual mode transistor 900a, 900b of FIGS. 9a and 9b, the SOI PNP dual mode transistor 1100 of FIG. 11, the SOI NPN dual mode transistor 1200 of FIG. 12, the dual mode transistor device 1450 of FIG. 14, the dual mode transistor device 1460 of FIG. 14, or any combination thereof, or any combination thereof.

In a particular embodiment, the fabrication process 1428 may be initiated by or controlled by a processor 1434. The processor 1434 may access a memory 1435 that includes executable instructions 1437, such as computer-readable instructions or processor-readable instructions. The executable instructions may include one or more instructions that are executable by a computer, such as the processor 1434. The fabrication process 1428 may be implemented by a fabrication system that is fully automated or partially automated. For example, the fabrication process 1428 may be automated and may perform processing steps according to a schedule. The fabrication system may include fabrication equipment (e.g., processing tools) to perform one or more operations to form an electronic device.

The fabrication system may have a distributed architecture (e.g., a hierarchy). For example, the fabrication system may include one or more processors, such as the processor 1434, one or more memories, such as the memory 1435, and/or controllers that are distributed according to the distributed architecture. The distributed architecture may include a high-level processor that controls and/or initiates operations of one or more low-level systems. For example, a high-level portion of the fabrication process 1428 may include one or more processors, such as the processor 1434, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component of the fabrication system may include a processor, such as the processor 1434.

Alternatively, the processor 1434 may be a part of a high-level system, subsystem, or component of the fabrication system. In another embodiment, the processor 1434 includes distributed processing at various levels and components of a fabrication system.

The die 1536 may be provided to a packaging process 1538 where the die 1536 is incorporated into a representative package 1540. For example, the package 1540 may include the single die 1536 or multiple dies, such as a system-in-package (SiP) arrangement. The package 1540 may be configured to conform to one or more standards or specifications, such as Joint Electron Device Engineering Council (JEDEC) standards.

Information regarding the package 1540 may be distributed to various product designers, such as via a component library stored at a computer 1546. The computer 1546 may include a processor 1548, such as one or more processing cores, coupled to a memory 1550. A printed circuit board (PCB) tool may be stored as processor executable instructions at the memory 1550 to process PCB design information 1542 received from a user of the computer 1546 via a user interface 1544. The PCB design information 1542 may include physical positioning information of a packaged semiconductor device on a circuit board, the packaged semiconductor device corresponding to the package 1540 including the a device that includes the dual mode transistor 100 of FIG. 1, at least one of the embodiments 310-340 of the FET-type configurations of FIG. 3, at least one of the embodiments 410-440 of the BJT-type configurations of FIG. 4, at least one of the embodiments 510, 520 of the inverter mixer of FIG. 5, the differential mixer 600 of FIG. 6, at least one of the embodiments 710, 720 of the inverter driver of FIG. 7, the PNP dual mode transistor 800a, 800b of FIGS. 8a and 8b, the NPN dual mode transistor 900a, 900b of FIGS. 9a and 9b, the SOI PNP dual mode transistor 1100 of FIG. 11, the SOI NPN dual mode transistor 1200 of FIG. 12, the dual mode transistor device 1450 of FIG. 14, the dual mode transistor device 1460 of FIG. 14, or any combination thereof.

The computer 1546 may be configured to transform the PCB design information 1542 to generate a data file, such as a GERBER file 1552 with data that includes physical positioning information of a packaged semiconductor device on a circuit board, as well as layout of electrical connections such as traces and vias, where the packaged semiconductor device corresponds to the package 1540 including the dual mode transistor 100 of FIG. 1, at least one of the embodiments 310-340 of the FET-type configurations of FIG. 3, at least one of the embodiments 410-440 of the BJT-type configurations of FIG. 4, at least one of the embodiments 510, 520 of the inverter mixer of FIG. 5, the differential mixer 600 of FIG. 6, at least one of the embodiments 710, 720 of the inverter driver of FIG. 7, the PNP dual mode transistor 800a, 800b of FIGS. 8a and 8b, the NPN dual mode transistor 900a, 900b of FIGS. 9a and 9b, the SOI PNP dual mode transistor 1100 of FIG. 11, the SOI NPN dual mode transistor 1200 of FIG. 12, the dual mode transistor device 1450 of FIG. 14, the dual mode transistor device 1460 of FIG. 14, or any combination thereof. In other embodiments, the data file generated by the transformed PCB design information may have a format other than a GERBER format.

The GERBER file 1552 may be received at a board assembly process 1554 and used to create PCBs, such as a representative PCB 1556, manufactured in accordance with the design information stored within the GERBER file 1552. For example, the GERBER file 1552 may be uploaded to one or more machines to perform various steps of a PCB production process. The PCB 1556 may be populated with electronic components including the package 1540 to form a representative printed circuit assembly (PCA) 1558.

The PCA 1558 may be received at a product manufacture process 1560 and integrated into one or more electronic devices, such as a first representative electronic device 1562 and a second representative electronic device 1564. As an illustrative, non-limiting example, the first representative electronic device 1562, the second representative electronic device 1564, or both, may be selected from the group of a set top box, a music player, a video player, an entertainment unit, a navigation device, a communications device, a personal digital assistant (PDA), a fixed location data unit, and a computer, into which the dual mode transistor 100 of FIG. 1, at least one of the embodiments 310-340 of the FET-type configurations of FIG. 3, at least one of the embodiments 410-440 of the BJT-type configurations of FIG. 4, at least one of the embodiments 510, 520 of the inverter mixer of FIG. 5, the differential mixer 600 of FIG. 6, at least one of the embodiments 710, 720 of the inverter driver of FIG. 7, the PNP dual mode transistor 800a, 800b of FIGS. 8a and 8b, the NPN dual mode transistor 900a, 900b of FIGS. 9a and 9b, the SOI PNP dual mode transistor 1100 of FIG. 11, the SOI NPN dual mode transistor 1200 of FIG. 12, the dual mode transistor device 1450 of FIG. 14, the dual mode transistor device 1460 of FIG. 14, or any combination thereof is integrated. As another illustrative, non-limiting example, one or more of the electronic devices 1562 and 1564 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. In addition to remote units according to teachings of the disclosure, embodiments of the disclosure may be suitably employed in any device which includes active integrated circuitry including memory and on-chip circuitry.

A device that includes the dual mode transistor 100 of FIG. 1, at least one of the embodiments 310-340 of the FET-type configurations of FIG. 3, at least one of the embodiments 410-440 of the BJT-type configurations of FIG. 4, at least one of the embodiments 510, 520 of the inverter mixer of FIG. 5, the differential mixer 600 of FIG. 6, at least one of the embodiments 710, 720 of the inverter driver of FIG. 7, the PNP dual mode transistor 800a, 800b of FIGS. 8a and 8b, the NPN dual mode transistor 900a, 900b of FIGS. 9a and 9b, the SOI PNP dual mode transistor 1100 of FIG. 11, the SOI NPN dual mode transistor 1200 of FIG. 12, the dual mode transistor device 1450 of FIG. 14, the dual mode transistor device 1460 of FIG. 14, or any combination thereof, may be fabricated, processed, and incorporated into an electronic device, as described in the illustrative process 1500. One or more aspects of the embodiments disclosed with respect to FIGS. 1-15 may be included at various processing stages, such as within the library file 1512, the GDSII file 1526, and the GERBER file 1552, as well as stored at the memory 1510 of the research computer 1506, the memory 1518 of the design computer 1514, the memory 1550 of the computer 1546, the memory of one or more other computers or processors (not shown) used at the various stages, such as at the board assembly process 1554, and also incorporated into one or more other physical embodiments such as the mask 1532, the die 1536, the package 1540, the PCA 1558, other products such as prototype circuits or devices (not shown), or any combination thereof. Although various representative stages of production from a physical device design to a final product are depicted, in other embodiments fewer stages may be used or additional stages may be included. Similarly, the process 1500 may be performed by a single entity or by one or more entities performing various stages of the process 1500.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
   biasing a transistor using a first gate voltage to enable unipolar current to flow from a first region of the transistor to a second region of the transistor according to a field-effect transistor (FET)-type operation; and
   biasing a body terminal to enable bipolar current to flow from the first region to the second region, wherein the bipolar current is tuned by a body terminal current according to a bipolar junction transistor (BJT)-type operation;
   wherein the unipolar current flows concurrently with the bipolar current.

2. The method of claim 1, wherein the unipolar current is associated with a digital metal oxide semiconductor (MOS) mode, and wherein the bipolar current is associated with an analog gate control bipolar junction transistor mode.

3. The method of claim 1, wherein the first gate voltage controls a current gain of the transistor, a transconductance of the transistor, and a resistance of the transistor.

4. The method of claim 1, wherein the transistor is an n-type metal oxide semiconductor (NMOS) and NPN-type device.

5. The method of claim 1, wherein the transistor is a p-type metal oxide semiconductor (PMOS) and PNP-type device.

6. The method of claim 1, wherein the transistor is a bulk complementary metal oxide semiconductor (CMOS) and BJT device.

7. The method of claim 1, wherein the transistor is a silicon-on-insulator (SOI) complementary metal oxide semiconductor (CMOS) and BJT device.

8. The method of claim 1, wherein the transistor is a planar complementary metal oxide semiconductor (CMOS) and a BJT device.

9. The method of claim 1, wherein the transistor is a three dimensional fin-type FET (3D Finfet) complementary metal oxide semiconductor (CMOS) and a BJT device.

10. The method of claim 1, wherein biasing the first gate voltage forms an inversion layer to enable unipolar current.

11. The method of claim 1, wherein the first region of the transistor corresponds to a source of the transistor, and wherein the second region of the transistor corresponds to a drain of the transistor.

12. The method of claim 1, wherein biasing the first gate voltage and biasing the body terminal are initiated by a processor integrated into an electronic device.

13. An apparatus comprising:
   a first gate region of a transistor that is configured to receive a first gate voltage to enable a unipolar current to flow from a first region of the transistor to a second region of the transistor according to a field-effect transistor (FET)-type operation; and
   a first body region of the transistor that is configured to receive a first body voltage to enable bipolar current to flow from the first region of the transistor to the second region of the transistor according to a bipolar junction transistor (BJT)-type operation concurrently with the unipolar current.

14. The apparatus of claim 13, wherein the first region corresponds to a source of the transistor.

15. The apparatus of claim 13, wherein the second region corresponds to a drain of the transistor.

16. The apparatus of claim 13, wherein the transistor is configured to operate in a unipolar operation mode and a bipolar operation mode, wherein the transistor is an n-type transistor, and wherein the first body voltage is greater than a forward junction voltage associated with the transistor.

17. The apparatus of claim 16, wherein the first gate voltage is equal to a supply voltage.

18. The apparatus of claim 13, wherein the transistor is configured to operate in a unipolar operation mode and a bipolar operation mode, wherein the transistor is a p-type transistor, and wherein the first body voltage is less than a negative forward junction voltage associated with the transistor.

19. The apparatus of claim 18, wherein the first gate voltage is equal to zero volts.

20. The apparatus of claim 13, further comprising:
   an inverter mixer circuit, wherein the inverter mixer circuit comprises:
      the transistor, wherein the first body voltage corresponds to a first input signal; and
      a second transistor, wherein a second body region of the second transistor is coupled to the first body region, wherein the second body region is configured to receive the first body voltage, wherein a second gate region of the second transistor is coupled to the first gate region, wherein the second gate region is configured to receive the first gate voltage, wherein the first gate voltage corresponds to a second input signal, and wherein a second drain region of the second transistor is coupled to a first drain region of the transistor.

21. The apparatus of claim 13, further comprising:
an inverter mixer circuit, wherein the inverter mixer circuit comprises:
the transistor, wherein the first body voltage corresponds to a first input signal; and
a second transistor, wherein a second body region of the second transistor is configured to receive a second body voltage that corresponds to a second input signal, wherein a second gate region of the second transistor is coupled to the first gate region, wherein the second gate region is configured to receive the first gate voltage, wherein the first gate voltage corresponds to a third input signal, and wherein a second drain region of the second transistor is coupled to a first drain region of the transistor.

22. The apparatus of claim 13, further comprising:
a differential mixer circuit, wherein the differential mixer circuit comprises:
the transistor, wherein the first gate voltage corresponds to a first signal of a first differential input signal, wherein the first body voltage corresponds to a second signal of a second differential input signal; and
a second transistor, wherein a second gate region of the second transistor is configured to receive a second gate voltage, wherein the second gate voltage corresponds to a second signal of the first differential input signal, wherein a second body region of the second transistor is configured to receive a first signal of the second differential input signal, and wherein a first source region of the transistor is coupled to a second source region of the second transistor.

23. The apparatus of claim 13, further comprising:
an inverter driver circuit, wherein the inverter driver circuit comprises:
the transistor, wherein the first gate voltage and the first body voltage correspond to a first input signal; and
a second transistor, wherein a second gate region of the second transistor is coupled to the first gate region, wherein a second body region of the second transistor is coupled to the first body region, wherein the second body region is configured to receive the first body voltage, and wherein a second drain region of the second transistor is coupled to a first drain region of the transistor.

24. The apparatus of claim 13, further comprising:
an inverter driver circuit, wherein the inverter driver circuit comprises:
the transistor, wherein the first body voltage corresponds to a first input signal, and wherein the first gate voltage correspond to a second input signal; and
a second transistor, wherein a second gate region of the second transistor is coupled to the first gate region, wherein the second gate region is configured to receive the first gate voltage, wherein a second body region of the second transistor is bias via a third input signal, and wherein a second drain region of the second transistor is coupled to a first drain region of the transistor.

25. The apparatus of claim 13, wherein the first gate region and the first body region are integrated into at least one semiconductor die.

26. The apparatus of claim 13, further comprising a device selected from the group consisting of a set top box, a music player, a video player, an entertainment unit, a navigation device, a communications device, a personal digital assistant (PDA), a fixed location data unit, and a computer, into which the first gate region and the first body region are integrated.

27. A non-transitory computer readable medium comprising instructions that, when executed by a processor, cause the processor to:
bias a gate of a transistor using a first gate voltage to enable a unipolar current to flow from a first region of the transistor to a second region of the transistor; and
bias a terminal coupled to a body region of the transistor to a second voltage such that an absolute value of a body-to-source voltage is greater than a junction voltage of the transistor, wherein biasing the terminal enables a bipolar current to flow from the first region of the transistor to the second region of the transistor concurrently with the unipolar current.

28. The non-transitory computer readable medium of claim 27, wherein the unipolar current is associated with a digital metal oxide semiconductor (MOS) mode, and wherein the bipolar current is associated with an analog gate control bipolar junction transistor mode.

29. An apparatus comprising:
means for receiving a first gate voltage to enable unipolar current to flow from a first region of a transistor to a second region of the transistor according to a field-effect transistor (FET)-type operation; and
means for biasing a body terminal to enable bipolar current to flow from the first region to the second region according to a bipolar junction transistor (BJT)-type operation concurrently with the unipolar current.

30. The apparatus of claim 13, wherein the first body region is further configured to adjust a magnitude of the unipolar current by generating the bipolar current in response to the first body voltage.

* * * * *